(12) United States Patent
Kozyrev

(10) Patent No.: US 10,236,860 B1
(45) Date of Patent: Mar. 19, 2019

(54) HIGH SELECTIVE (BRICK WALL) FILTERS BASED ON FANO RESONANCES

(71) Applicant: Rockwell Collins, Inc., Cedar Rapids, IA (US)

(72) Inventor: Alexander B. Kozyrev, Iowa City, IA (US)

(73) Assignee: ROCKWELL COLLINS, INC., Cedar Rapids, IA (US)

(*) Notice: Subject to any disclaimer, the term of this patent is extended or adjusted under 35 U.S.C. 154(b) by 48 days.

(21) Appl. No.: 15/653,527

(22) Filed: Jul. 19, 2017

(51) Int. Cl.
| | |
|---|---|
| *H03H 7/01* | (2006.01) |
| *H03H 9/54* | (2006.01) |
| *H03H 3/02* | (2006.01) |
| *H03H 9/02* | (2006.01) |
| *H03H 9/17* | (2006.01) |
| *H03H 3/04* | (2006.01) |
| *H03H 1/00* | (2006.01) |

(52) U.S. Cl.
CPC ............ *H03H 9/54* (2013.01); *H03H 1/0007* (2013.01); *H03H 3/02* (2013.01); *H03H 3/04* (2013.01); *H03H 7/0115* (2013.01); *H03H 7/0161* (2013.01); *H03H 9/02118* (2013.01); *H03H 9/17* (2013.01); *H03H 9/542* (2013.01)

(58) Field of Classification Search
CPC ...... H03H 1/0007; H03H 7/0115; H03H 7/01; H03H 7/0161; H03H 7/12; H03H 7/0153; H03H 7/46; H03H 7/463
USPC ................ 333/167, 168, 174, 132, 100, 186
See application file for complete search history.

(56) References Cited

U.S. PATENT DOCUMENTS

2015/0301550 A1* 10/2015 Corum ...................... H02J 3/28
                                                            333/112

* cited by examiner

*Primary Examiner* — Stephen E. Jones
(74) *Attorney, Agent, or Firm* — Donna P. Suchy; Daniel M. Barbieri

(57) ABSTRACT

A filter circuit can include a plurality of elementary Fano resonator circuits electrically coupled to each other. Each elementary Fano resonator circuit can include a closed loop circuit including a combination of at least three inductive and/or capacitive components and at least two ports. At least one port of the at least two ports can correspond to a node of the filter circuit not within the closed loop circuit. The elementary Fano resonator circuit can also include a branch including at least one other inductive or capacitive component and extending between a node of the closed loop circuit and a port of the at least one port corresponding to a node of the filter circuit not within the closed loop circuit.

20 Claims, 24 Drawing Sheets

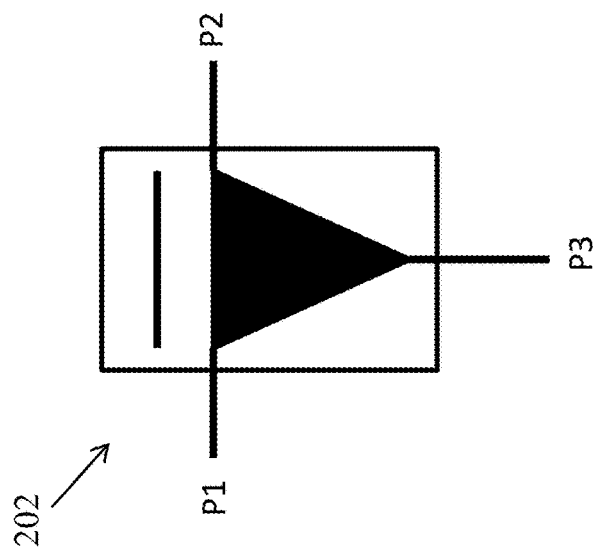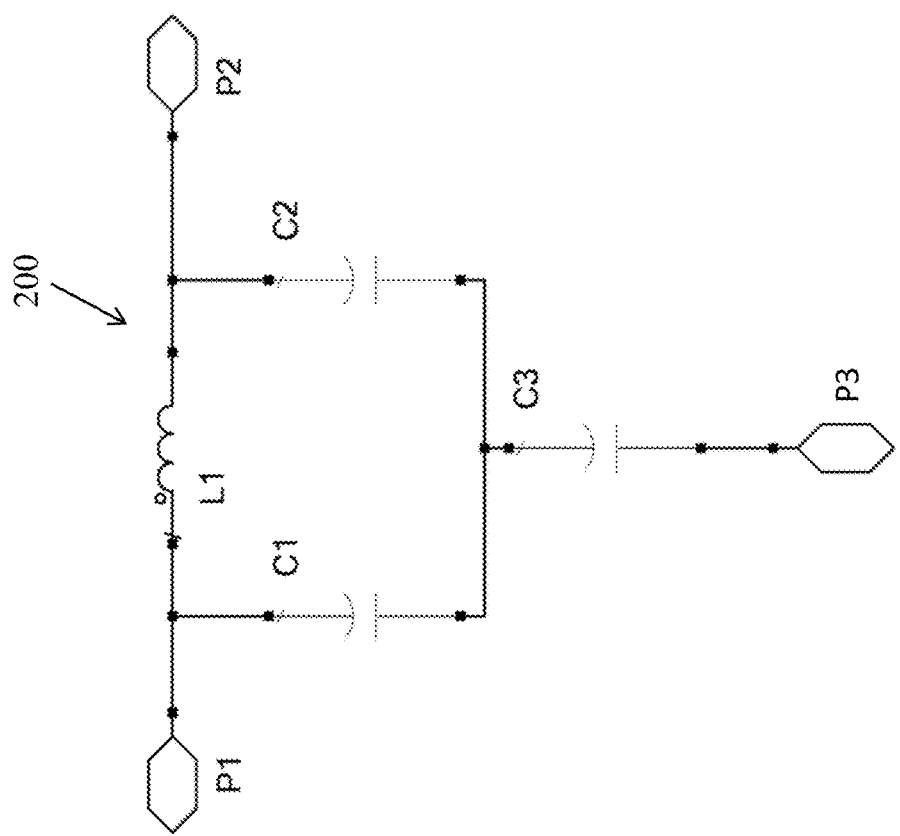
FIG. 2

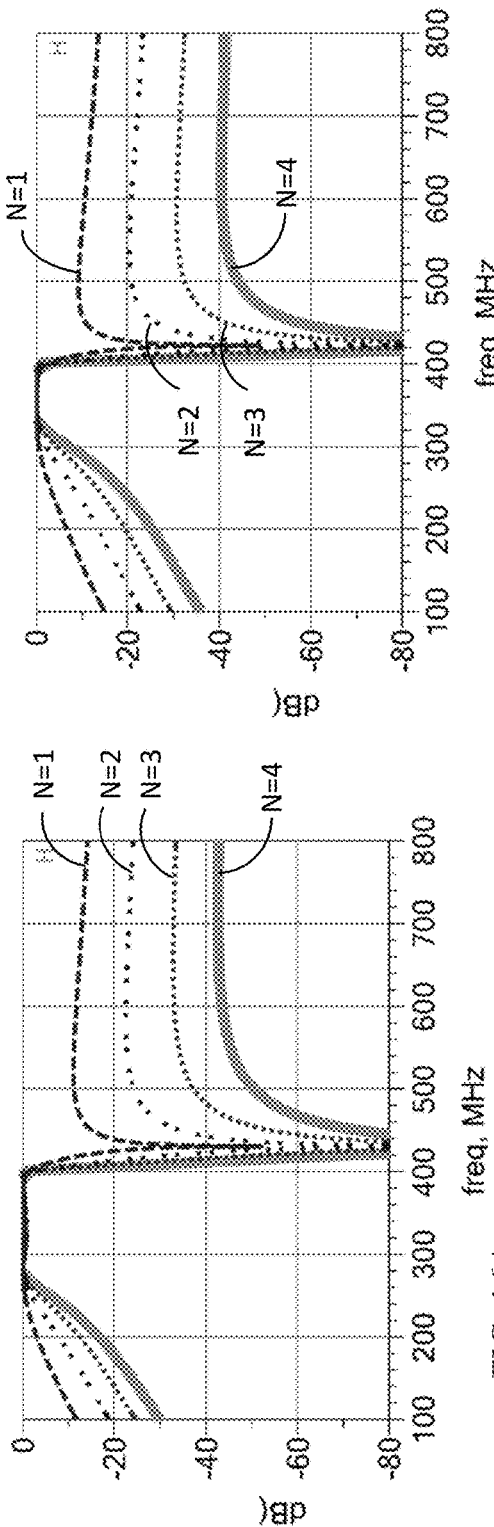
FIG. 16A
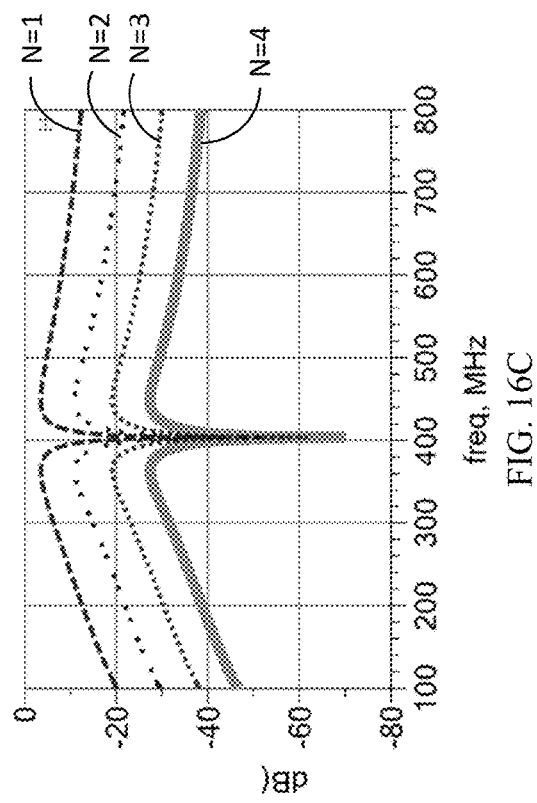
FIG. 16B
FIG. 16C

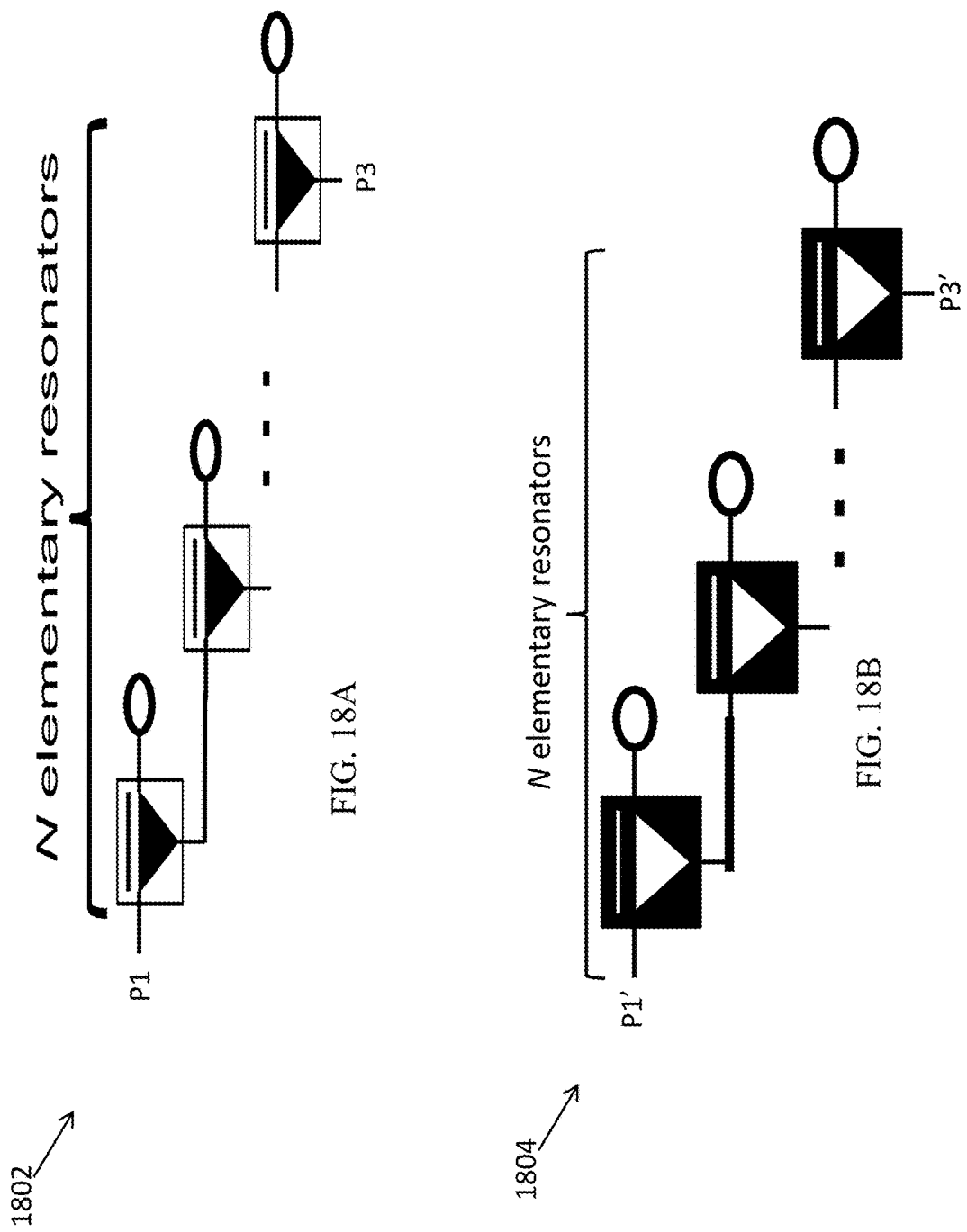

US 10,236,860 B1

HIGH SELECTIVE (BRICK WALL) FILTERS BASED ON FANO RESONANCES

BACKGROUND

Analog filters present an indispensable tool for selectively passing or blocking electric signals in systems such as communications networks, analog to digital converters (ADCs), audio systems, radar and/or antenna systems, or other electric/electronic systems. In many of these systems, there is a demand for near ideal, or substantially ideal, filters. An ideal filter perfectly passes signals within the respective pass-band and perfectly blocks out-of-band signals. However, ideal filters are non-causal and have infinite delays. Accordingly, one of the goals of analog filter design research has been to design and build near ideal filter circuits. Near ideal filter circuits have frequency responses characterized by steep cutoff edges, almost-rectangular pass-bands, and substantial out-of-band signal suppression.

Whether in wireless communications networks, radar systems, ADCs or other electric systems, near ideal filters can provide a valuable tool to eliminate (or substantially mitigate) undesired signal interference or to accurately block undesired signals associated with specific frequency characteristics. Accordingly, near ideal filters can allow for efficient use of the frequency spectrum in various communications systems.

SUMMARY

In one aspect, the inventive concepts disclosed herein are directed to a filter circuit including a plurality of elementary Fano resonator circuits electrically coupled to each other. Each elementary Fano resonator circuit can include a closed loop circuit including a combination of at least three inductive and/or capacitive components and at least two ports. At least one port of the at least two ports can correspond to a node of the filter circuit not within the closed loop circuit. The elementary Fano resonator circuit can also include a branch including at least one other inductive or capacitive component and extending between a node of the closed loop circuit and a port of the at least one port corresponding to a node of the filter circuit not within the closed loop circuit.

The filter circuit can be a low-pass filter. The filter circuit can be a high-pass filter. The filter circuit can be a band-pass filter. The transfer function of each elementary Fano resonator circuit of the plurality of elementary Fano resonator circuits can include one pole and one zero. The transfer function of each elementary Fano resonator circuit of the plurality of elementary Fano resonator circuits can include two poles and one zero. The closed loop circuit of each elementary Fano resonator circuit of the plurality of elementary Fano resonator circuits can include two capacitors and an inductor, and the branch of that elementary Fano resonator circuit can include a capacitor. The closed loop circuit of each elementary Fano resonator circuit of the plurality of elementary Fano resonator circuits can include two inductors and a capacitor, and the branch of that elementary Fano resonator circuit can include an inductor.

The plurality of elementary Fano resonator circuits can be electrically coupled to each other in series. The plurality of elementary Fano resonator circuits can be electrically coupled to each other via ports corresponding to nodes within respective closed loop circuits. The plurality of elementary Fano resonator circuits can be electrically coupled to each other via ports corresponding to nodes within respective closed loop circuits and nodes associated with respective branches.

The plurality of elementary Fano resonator circuits can include a first subset of elementary Fano resonator circuits associated with a first type of elementary Fano resonator circuits and a second subset of elementary Fano resonator circuits associated with a second type of elementary Fano resonator circuits. The first type of elementary Fano resonator circuits and the second type of elementary Fano resonator circuits can differ with respect to a number of respective inductive components, a number of respective capacitive components, inductance values of respective inductive components, or capacitance values of respective capacitive components.

The plurality of elementary Fano resonator circuits can include a first subset of elementary Fano resonator circuits electrically coupled in series and a second subset of elementary Fano resonator circuits. Each elementary Fano resonator circuit of the second subset can be electrically coupled between one of the ports of a respective elementary Fano resonator circuit in the first subset and an electric ground. At least two of the plurality of elementary Fano resonator circuits can be associated with distinct frequency characteristics.

In a further aspect, the inventive concepts disclosed herein are directed to a filter circuit including a plurality of elementary Fano resonator circuits electrically coupled to each other. Each elementary Fano resonator circuit can include a closed loop circuit including a combination of at least four inductive and/or capacitive components, and four ports. Two ports of the four ports can correspond to nodes of the filter circuit not within the closed loop circuit. The elementary Fano resonator circuit can include a first branch including a first inductive or capacitive component and a second branch including a second inductive or capacitive component. The first branch can extend between a first node of the closed loop circuit and a first port of the two ports corresponding to nodes of the filter circuit not within the closed loop circuit. The second branch can extend between a second node of the closed loop circuit and a second port of the two ports corresponding to nodes of the filter circuit not within the closed loop circuit.

The closed loop circuit of each elementary Fano resonator circuit of the plurality of elementary Fano resonator circuits can include two inductors and two capacitors. The first branch of that elementary Fano resonator circuit can include an inductor, and the second branch of that elementary Fano resonator circuit can include a capacitor. The filter circuit can further include a first inductor and a first capacitor electrically coupled in parallel between a third port of the filter circuit and an electric ground. The third port can be different than any of the two ports corresponding to nodes of the filter circuit not within the closed loop circuit. The filter circuit can also include a second inductor and a second capacitor electrically coupled in parallel between a fourth port of the filter circuit and an electric ground. The fourth port can be different than any of the two ports corresponding to nodes of the filter circuit not within the closed loop circuit.

In a further aspect, the inventive concepts disclosed herein are directed to a filter circuit including a plurality of elementary Fano resonator circuits electrically coupled to each other. Each elementary Fano resonator circuit can include a closed loop circuit including a combination of at least six inductive and/or capacitive components and four ports. Two ports of the four ports can correspond to nodes of the filter circuit not within the closed loop circuit. The elementary Fano resonator circuit can include a plurality of first parallel branches including a first plurality of parallel inductive and/or capacitive components. The plurality of first parallel branches can extend between a corresponding plurality of first nodes of the closed loop circuit and a first port of the two ports corresponding to nodes of the filter circuit not within the closed loop circuit. The elementary Fano resonator circuit can include a plurality of second parallel branches including a second plurality of parallel inductive and/or capacitive components. The plurality of second parallel branches can extend between a corresponding plurality of second nodes of the closed loop circuit and a second port of the two ports corresponding to nodes of the filter circuit not within the closed loop circuit.

The closed loop circuit can include N inductors arranged in parallel to N capacitors where N is an integer number. The plurality of first parallel branches can be electrically coupled to nodes of the N inductors, and the plurality of second parallel branches can be electrically coupled to nodes of the N capacitors.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function.

FIG. 2 shows a circuit representing an example implementation of the elementary Fano resonator circuit shown in FIG. 1 and a corresponding symbol, according to inventive concepts of this disclosure;

FIGS. 16A-16E show simulations results for various versions of the band-pass circuit shown in FIG. 14D, according to inventive concepts of this disclosure;

FIGS. 18A and 18B show block diagrams illustrating other arrangements of elementary Fano resonator circuits to form other types of filters, according to inventive concepts of this disclosure;

Figure 1:
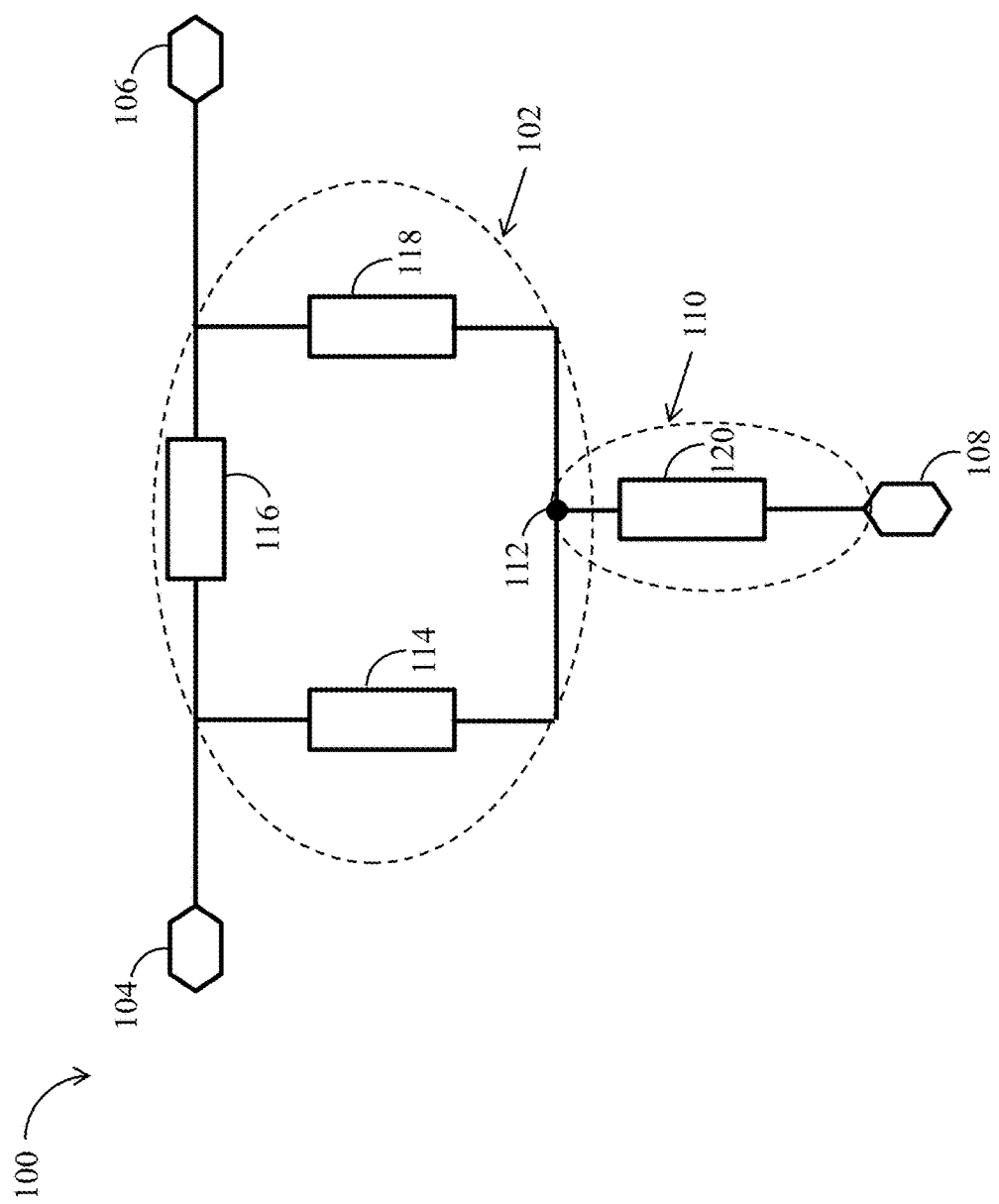
FIG. 1 shows a block diagram illustrating a first example embodiment of an elementary Fano resonator circuit, according to inventive concepts of this disclosure.

The details of various embodiments of the methods and systems are set forth in the accompanying drawings and the description below.

DETAILED DESCRIPTION

Before describing in detail embodiments of the inventive concepts disclosed herein, it should be observed that the inventive concepts disclosed herein include, but are not limited to a novel structural combination of components and circuits, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Highly selective filters, such as brick wall filters, are desirable for many applications as they are able to minimize the guard band between adjacent channels so as to use the frequency spectrum more efficiently. In this disclosure asymmetric Fano resonance can be employed to design near ideal filters (e.g., brick wall filters). Asymmetric Fano resonances naturally introduce very sharp edges in transmission characteristics. Asymmetric Fano resonance can be achieved via electric circuits having alternative (or multiple) transmission paths between input and output ports. In the current disclosure, Fano resonator elements including a closed loop circuit and a branch extending from the closed loop circuit can be used as basic building blocks to design and construct filters with some desired characteristics. The closed loop circuit of each Fano resonator element can include multiple inductive and/or capacitive components, and the branch of that Fano resonator element can include another capacitive and/or inductive component. The alternative transmission paths result in constructive and destructive interferences between signals associated with the distinct paths and therefore cause asymmetric Fano resonance.

Referring now to the drawings, FIG. 1 shows a block diagram illustrating a first example embodiment of an elementary Fano resonator circuit (also referred to herein as Fano resonator element) 100, according to inventive concepts of this disclosure. The elementary Fano resonator circuit 100 can include a closed loop circuit 102, three ports 104, 106, and 108, and a branch 110 connecting a node 112 of the closed loop circuit 102 to the port 108. The closed loop circuit 102 can include a combination of three inductive and/or capacitive components 114, 116, and 118. The branch 110 can include another inductive and/or capacitive component 120. As used herein (and throughout this disclosure), an inductive component may not necessarily be purely inductive as it may include, for example, one or more internal or external capacitive and/or resistive components. The inductive component can include a single inductor or a plurality of inductors electrically coupled to each other in parallel, in series, or according to a combination of parallel and series connections. Also, as used herein (and throughout this disclosure), a capacitive component may not necessarily be purely capacitive as it may include, for example, one or more internal or external inductive and/or resistive components. The capacitive component can include a single capacitor or a plurality of capacitors electrically coupled to each other in parallel, in series, or according to a combination of parallel and series connections.

The closed loop circuit 102 allows for two separate transmission (or electric current) paths between each pair of the ports 104, 106, and 108, with each signal path including inductive and/or capacitive components. Any pair of the ports 104, 106, and 108 can operate as input and output ports while the other (or third) port can be connected to the electric ground or can be left open (e.g., omitted). In the case where a port is left open, the elementary Fano resonator circuit 100 can be viewed as having two ports. The existence of two transmission paths (or transmission channels) between the input and output ports (e.g., 104 and 106 or 104 and 108) allows for asymmetric Fano resonance to take place. In particular, interference of electric signals from distinct transmission channels leads to asymmetric Fano resonance effects. Constructive signal interference results in signal transmission enhancement while destructive interference due to signal reflections in both channels can cause signal suppression. The asymmetry is due to the close coexistence of resonant transmission and resonant reflection or a pole-zero pair characterizing the transfer function of the elementary Fano resonator circuit 100. The Laplace transform of the transfer function of the elementary Fano resonator circuit 100 has a single pole and a single zero.

Referring to FIG. 2, a circuit 200 representing an example implementation of the elementary Fano resonator circuit 100 shown in FIG. 1 and a corresponding symbol 202 are shown, according to inventive concepts of this disclosure. The ports P1, P2 and P3 correspond to the ports 104, 106, and 108 of the elementary Fano resonator circuit 100, respectively. The components 114 and 118 can be implemented as capacitors C1 and C2, the component 116 can be implemented as inductor L1, and the component 120 can be implemented as capacitor C3. The transfer function of the circuit 200 has a single pole and a single zero and the circuit 200 has a single Fano resonance. The symbol 202 as used herein is representative of the circuit 200.

In some cases, the ports P1 and P2 of the circuit 200 can be used as the input and output ports, while the port P3 can be connected to the electric ground. In such cases, the transfer function of the circuit 200 can be defined based on the voltages and/or electric currents at the ports P1 and P2. In some other scenarios, the port P2 can be left open and the ports P1 and P3 can act as the input and output ports. In such scenarios, the circuit 200 can be viewed as including two ports (P2 may not be considered as a port), and the transfer function of the circuit 200 can be defined based on the voltages and/or electric currents at the ports P1 and P3. Alternatively, the port P1 may be left open, and the ports P2 and P3 can act as the input and output ports. Accordingly, the transfer function of the circuit 200 can be defined based on the voltages and/or electric currents at the ports P2 and P3.

Figures 3A, 3B:
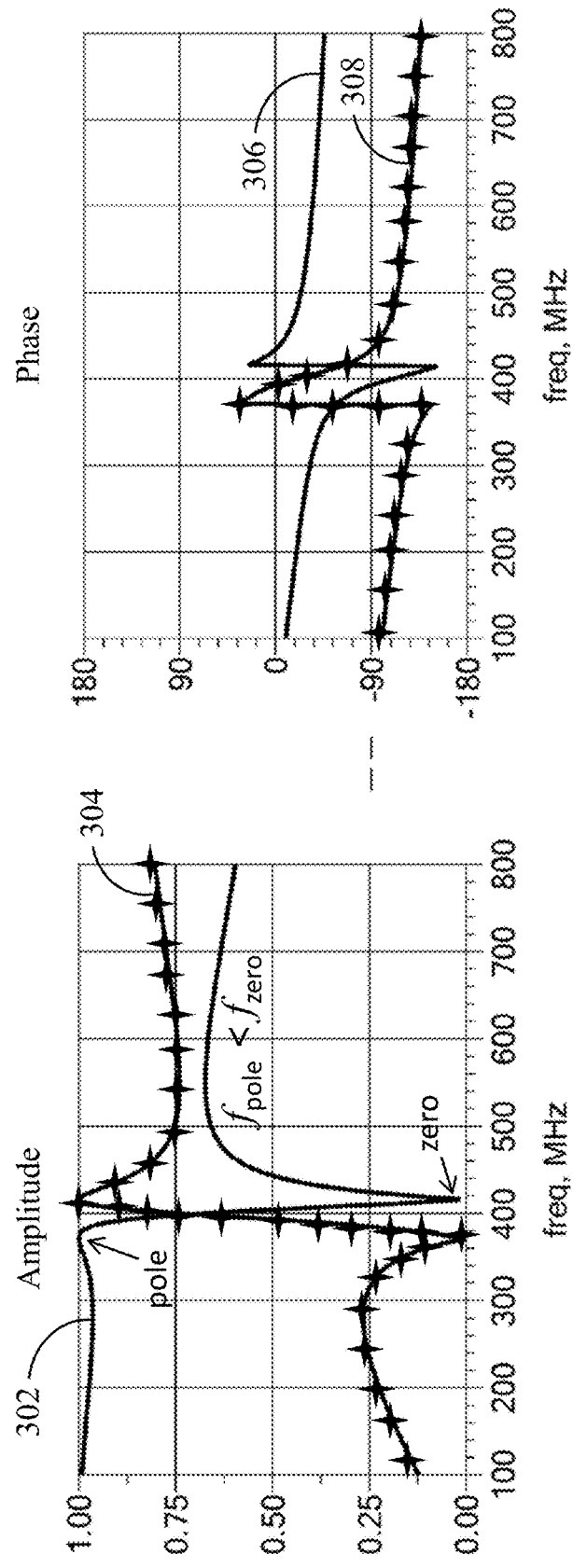
FIGS. 3A and 3B show simulation results representing the magnitudes and phases of the transmission coefficient and reflective coefficient of the circuit in FIG. 2, according to inventive concepts of this disclosure.

Referring to FIGS. 3A and 3B, simulation results representing the magnitudes and phases of the transmission coefficient and reflective coefficient of circuit 200 are shown, according to inventive concepts of this disclosure. In generating the simulation results in FIGS. 3A and 3B, the port P3 is connected to the electric ground and the ports P1 and P2 are used as the input and output ports, respectively. Also, the values of the capacitors C1, C2, and C3 are equal to 48 pico Farad (pF), 84 pF, and 10 pF, respectively. The inductance value for the inductor L1 is equal to 3.7 nano Henry (nH). The plots 302 and 304 represent the magnitudes of the transmission coefficient and the reflective coefficient, respectively, between the ports P1 and P2. The plots 306 and 308 represent the phases of the transmission coefficient and the reflective coefficient, respectively, between the ports P1 and P2. Considering the plot 302, one can see that the circuit 200 (with P1 and P2 acting as the input and output ports and P3 connected to the electric ground) acts as a low pass filter with a cutoff edge characterized by a sharp (or steep) slope.

The transmission coefficient of the circuit 200 has a single pole and a single zero, as shown on the plot 302. The reflective coefficient of the circuit 200 also has a single pole and a single zero. The frequency of the zero $f_{zero}$ is defined by the resonant frequency of the loop circuit formed by the inductance L1 and capacitances C1 and C2:

$$f_{zero} = \frac{1}{2\pi\sqrt{L1\frac{C1 \cdot C2}{C1+C2}}}$$

The frequency of the pole is defined by the condition when the input impedance of the elementary Fano resonator 200 (when looking from P1) is equal to the impedance of the port P1. Parameters of the elementary Fano resonator circuit 200 can be adjusted so that $f_{zero}$ and $f_{pole}$ are very close to each other thus making possible very sharp transition between transmission of rejection. The frequency of the pole (e.g., $f_{pole}$) for the transmission coefficient is smaller than the frequency of the corresponding zero (e.g., $f_{zero}$). Accordingly, the circuit 200 acts as a low-pass filter. For the reflective coefficient, the frequency of the respective pole is greater than the frequency of the respective zero.

Figure 4:
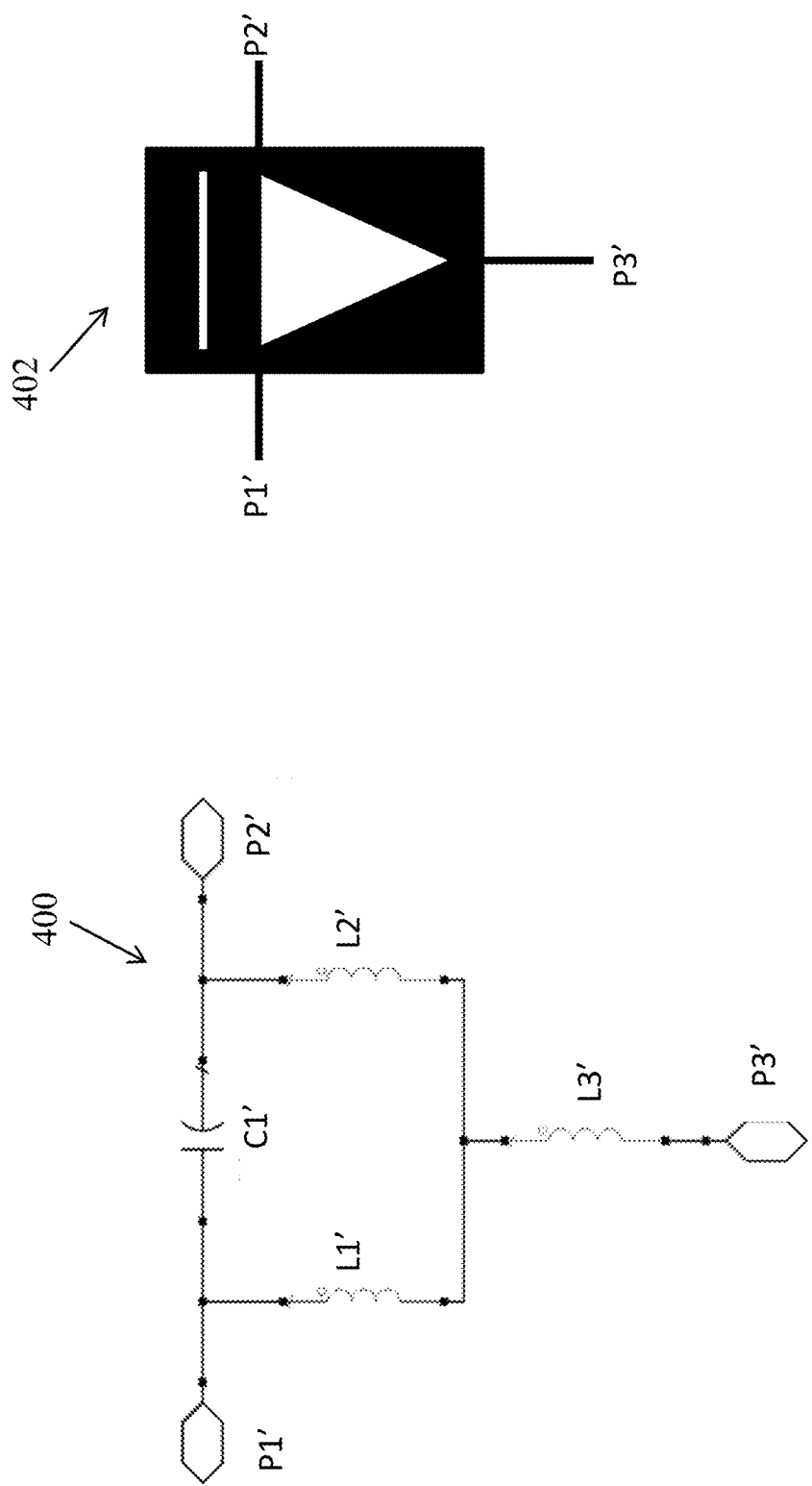
FIG. 4 shows a circuit representing an example implementation of the elementary Fano resonator circuit of FIG. 1 and a corresponding symbol, according to inventive concepts of this disclosure.

Referring to FIG. 4, a circuit 400 representing another example implementation of the elementary Fano resonator circuit 100 shown in FIG. 1 and a corresponding symbol 402 are shown, according to inventive concepts of this disclosure. The ports P1', P2' and P3' correspond to the ports 104, 106, and 108 of the elementary Fano resonator circuit 100, respectively. The components 114 and 118 can be implemented as inductors L1' and L2', the component 116 can be implemented as capacitor C1', and the component 120 can be implemented as inductor L3'. The transfer function (or transmission coefficient) of the circuit 400 has a single pole and a single zero and the circuit 400 has a single Fano resonance. The symbol 402 as used herein is representative of the circuit 400.

Similar to the circuit 200, the ports P1' and P2' of the circuit 400 can be used as the input and output ports, while the port P3' can be connected to the electric ground. As such, the transfer function (or the transmission coefficient) of the circuit 400 can be defined based on the voltages and/or electric currents at the ports P1' and P2'. Alternatively, the port P2' can be left open (or omitted) and the ports P1' and P3' can act as the input and output ports. By omitting the port P2', the circuit 400 can be viewed as having two ports P1' and P3', and the transfer function of the circuit 400 can be defined based on the voltages and/or electric currents at the ports P1' and P3'. According to other scenarios, the port P1' may be left open (or omitted), and the ports P2' and P3' can act as the input and output ports. Accordingly, the transfer function of the circuit 400 can be defined based on the voltages and/or electric currents at the ports P2' and P3', and the circuit 400 may be viewed as having only two ports P2' and P3'.

Figures 5A, 5B:
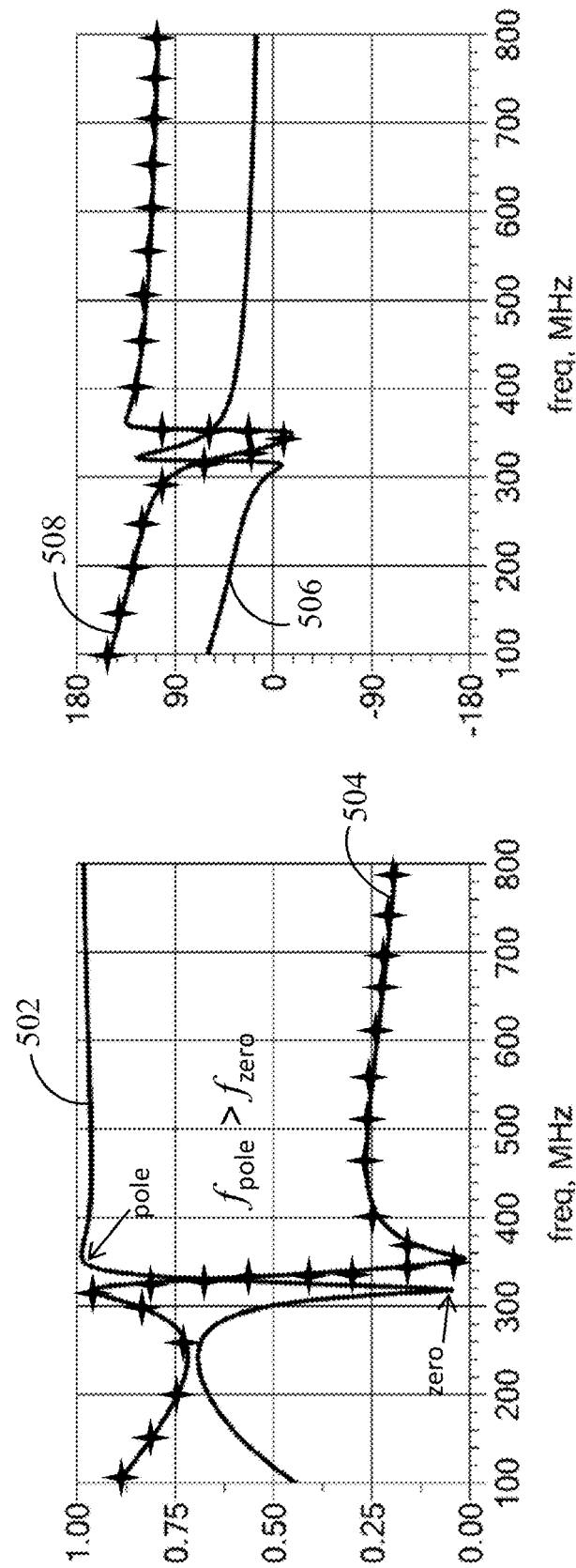
FIGS. 5A and 5B show simulation results representing the magnitudes and phases of the transmission coefficient and reflective coefficient of the circuit in FIG. 4, according to inventive concepts of this disclosure.

Referring to FIGS. 5A and 5B, simulation results representing the magnitudes and phases of the transmission coefficient and reflective coefficient of circuit 400 are shown, according to inventive concepts of this disclosure. In generating the simulation results in FIGS. 5A and 5B, the port P3' is connected to the electric ground and the ports P1' and P2' are used as the input and output ports, respectively. Also, the capacitance value for the capacitor C1' is equal to 56.4 pF, and the inductance values for the inductors L1', L2', L3' are equal to 2.1 nH, 2.1 nH, and 20 nH, respectively. The plots 502 and 504 represent the magnitudes of the transmission coefficient and the reflective coefficient, respectively, between the ports P1' and P2'. The plots 506 and 508 represent the phases of the transmission coefficient and the reflective coefficient, respectively, between the ports P1' and P2'. Considering the transmission coefficient illustrated through the plot 502, one can see that the circuit 400 (with ports P1' and P2' acting as the input and output ports and port P3' connected to the electric ground) acts as a high-pass filter with a cutoff edge characterized by a sharp (or steep) slope.

Similar to the circuit 200, the transmission coefficient (or transfer function) of the circuit 400 has a single pole and a single zero, as shown on the plot 502. The reflective coefficient of the circuit 400 also has a single pole and a single zero. The frequency of the zero $f_{zero}$ is defined by the resonant frequency of the loop circuit formed by the capacitance C1' and inductances L1' and L2':

$$f_{zero} = \frac{1}{2\pi\sqrt{(L1'+L2')\cdot C1'}}.$$

The frequency of the pole is defined by the condition when the input impedance of the elementary Fano resonator 400 (when looking from P1') is equal to the impedance of the port P1'. Parameters of the elementary Fano resonator 400 can be adjusted so that $f_{zero}$ and $f_{pole}$ are very close to each other thus making possible very sharp transition between transmission of rejection. The frequency of the pole (e.g., $f_{pole}$) for the transmission coefficient is greater than the frequency of the corresponding zero (e.g., $f_{zero}$). Accordingly, the circuit 400 acts as a high-pass filter. For the reflective coefficient, the frequency of the respective pole is smaller than the frequency of the respective zero.

Referring back to FIG. 1, the components 114 and 118 can be of the same type (e.g., both inductors or both capacitors), while the component 116 can be of different type than the components 114 and 118. For example, if the components 114 and 118 are both inductors, the component 116 can be a capacitor, and if the components 114 and 118 are both capacitors, the component 116 can be an inductor. The component 120 can be an inductor or a capacitor regardless of the types of the components 114, 116, and 118.

Figure 6:
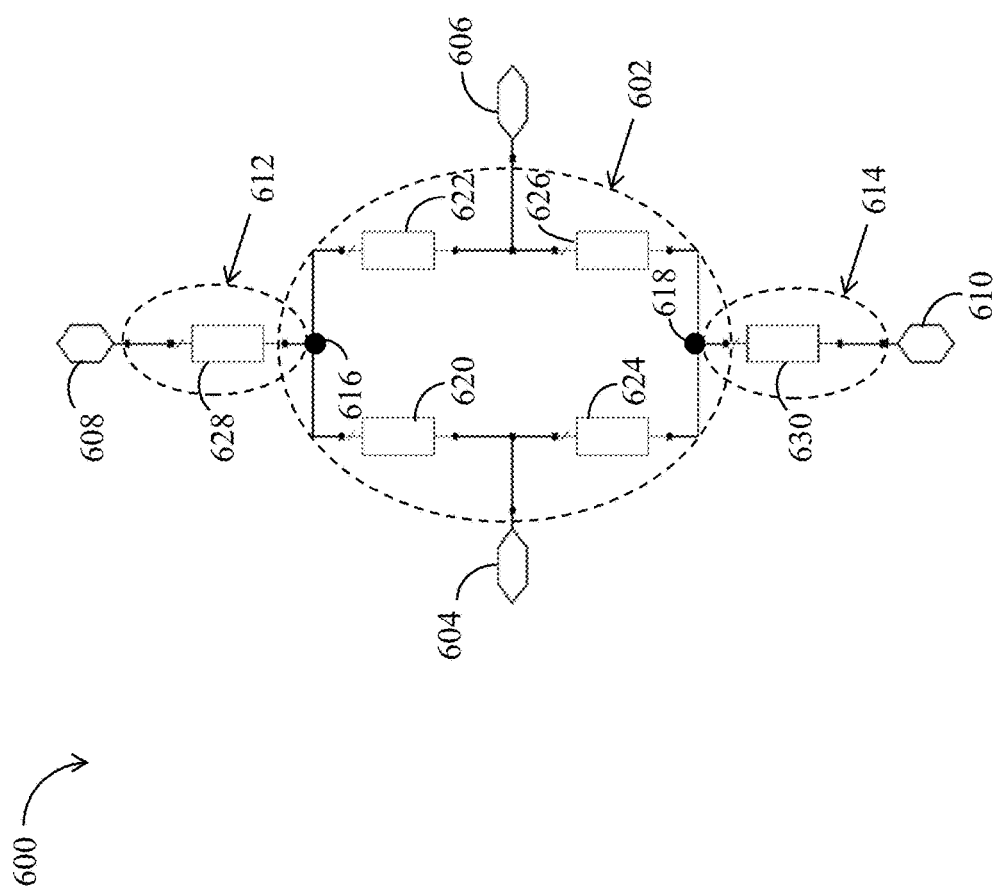
FIG. 6 shows a block diagram illustrating a second example embodiment of an elementary Fano resonator circuit, according to inventive concepts of this disclosure

Referring now to FIG. 6, a block diagram illustrating a second example embodiment of an elementary Fano resonator circuit 600 is shown, according to inventive concepts of this disclosure. Similar to the Fano resonator element 100, the elementary Fano resonator circuit (also referred to herein as Fano resonator element) 600 can include a closed loop circuit 602. However, the elementary Fano resonator circuit 600 can include four ports 604, 606, 608, 610, and two branches 612 and 614. The branch 612 can connect a node 616 of the closed loop circuit 602 to the port 608, and the branch 614 can connect a node 618 of the closed loop circuit 602 to the port 610. The closed loop circuit 602 can include a combination of four inductive and/or capacitive components 620, 622, 624, and 626. The branch 612 can include an inductive and/or capacitive component 628, and the branch 614 can include an inductive and/or capacitive component 630.

Similar to the Fano resonator element 100, the closed loop circuit 602 allows for two separate transmission (or electric current) paths between any pair of the ports 604, 606, 608, and 610 with each signal path including inductive and/or capacitive components. In general, any pair of the ports 604, 606, 608, 610 can selected to operate as input and output ports while the other ports can be connected to the electric ground or can be left open. In the case where a port is left open, that port may be considered as omitted or not part of the elementary Fano resonator circuit 600. Similar to the Fano resonator element 100 shown in FIG. 1, the existence of two transmission paths (or transmission channels) between input and output ports (e.g., 604 and 606) allows for asymmetric Fano resonance to take place. In particular, interference of electric signals from distinct transmission channels leads to asymmetric Fano resonance effects.

Figure 7:
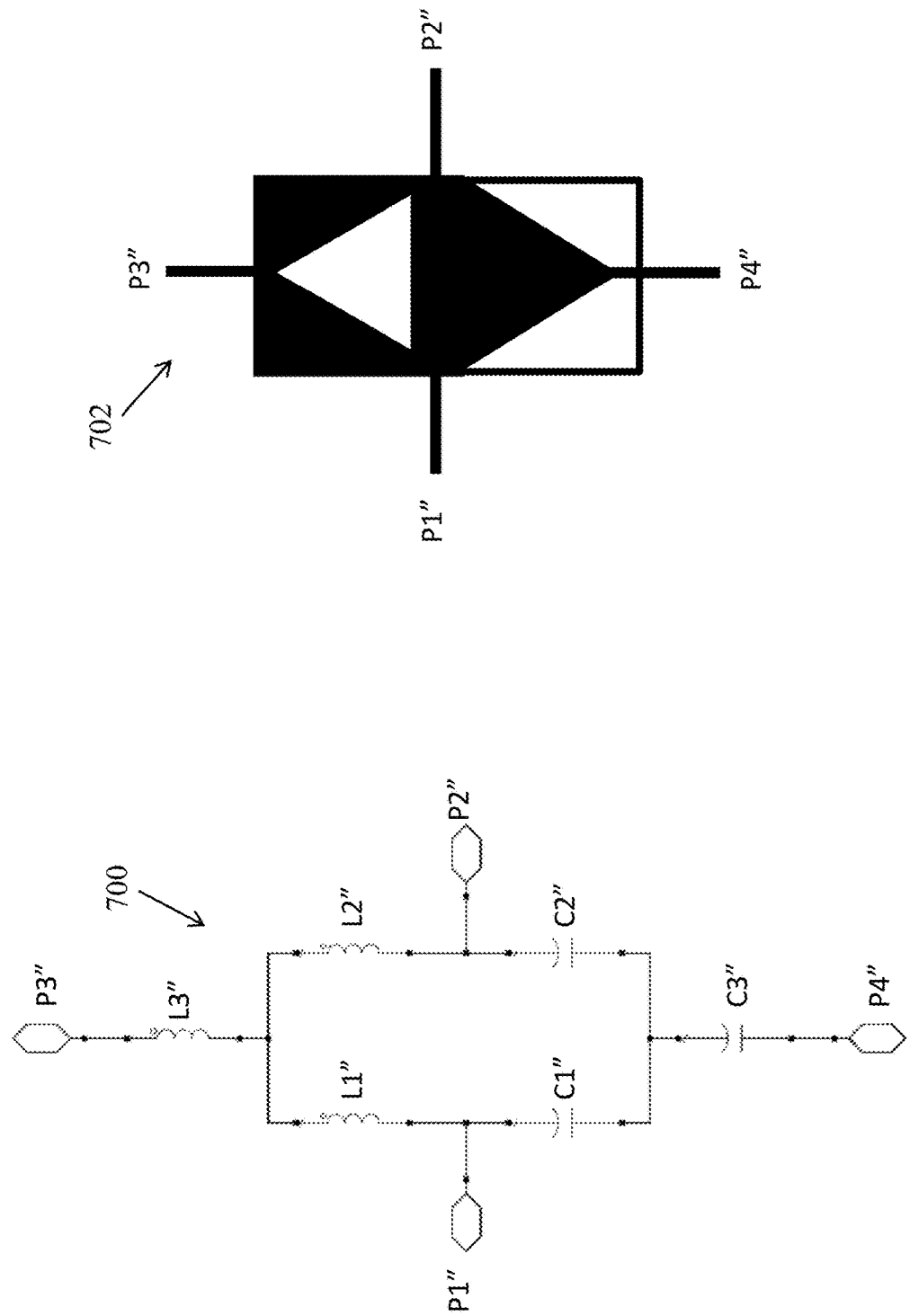
FIG. 7 shows a circuit representing an example implementation of the elementary Fano resonator circuit in FIG. 6 and a corresponding symbol, according to inventive concepts of this disclosure.

Referring to FIG. 7, a circuit 700 representing an example implementation of the elementary Fano resonator circuit 600 shown in FIG. 6 and a corresponding symbol 702 are shown, according to inventive concepts of this disclosure. The ports P1", P2", P3" and P4" correspond to the ports 604, 606, 608, and 610 of the elementary Fano resonator circuit 600, respectively. The components 620 and 622 can be implemented as inductors L1" and L2", the components 624 and 626 can be implemented as capacitors C1" and C2", the component 628 can be implemented as inductor L3", and the component 630 can be implemented as capacitor C3". The symbol 702 as used herein is representative of the circuit 700.

According to example embodiments, the ports P1" and P2" of the circuit 700 can be used as the input and output ports, while the ports P3" and P4" can be connected to the electric ground. As it is illustrated below in further detail, the transfer function of the circuit 700 has two poles and a single zero. According to other embodiments, another pair of ports (e.g., other than the (P1", P2") pair) can be used as the input and output ports. Also, in some other embodiments, the port P1", and/or the port P2" may be left open (or omitted).

Referring to FIGS. 8A-8E, simulation results representing the magnitudes of the transmission coefficient and reflective coefficient for various versions of the circuit 700 are shown, according to inventive concepts of this disclosure. In generating the simulation results in FIGS. 8A-8E, both ports P3" and P4" are connected to the electric ground and the ports P1" and P2" are used as the input and output ports, respectively. Also, both capacitors C1" and C2" have a capacitance value equal to 84 pF, and both inductors L1" and L2" have an inductance value equal to 1.85 nH. The simulation results in FIGS. 8A-8E correspond to distinct capacitance values for capacitor C3" and distinct inductance values for inductor L3".

Figure 8A:
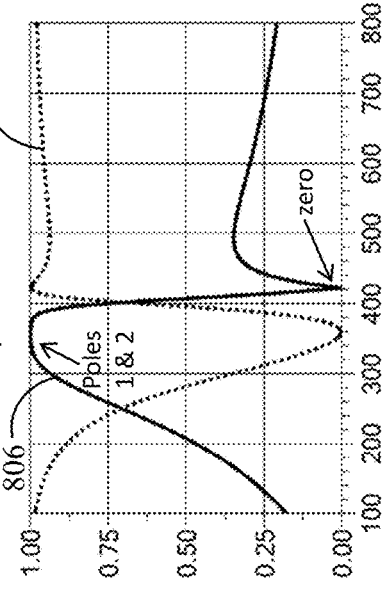
FIGS. 8A-8E show simulation results representing the magnitudes of the transmission coefficient and reflective coefficient for various versions of the circuit in FIG. 7, according to inventive concepts of this disclosure.
Figure 8B:
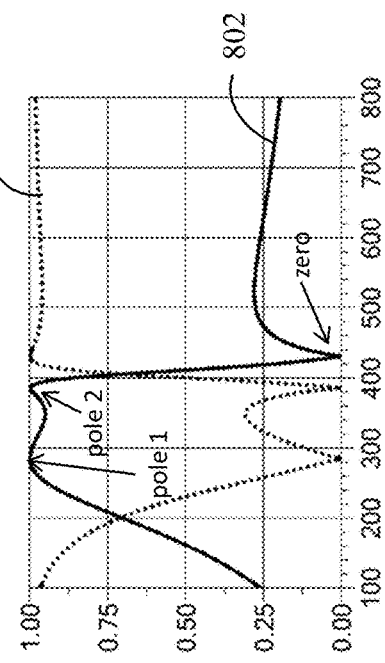

For instance, FIG. 8A shows the transmission coefficient magnitude 802 and the reflective coefficient magnitude 804 between ports P1" and P2" of circuit 700 when the capacitance value for capacitor C3" is half that of capacitor C1" (or capacitor C2"), and the inductance value for inductor L3" is five times that of inductor L1" (or inductor L2"). In such case, the frequencies for both poles (e.g., pole 1 and pole 2) of the transfer function are different from each other and both are smaller than the frequency for the zero of the transfer function (or transmission coefficient). FIG. 8B shows the transmission coefficient magnitude 806 and the reflective coefficient magnitude 808 between ports P1" and P2" of circuit 700 when the capacitance value for capacitor C3" is half that of capacitor C1" (or capacitor C2"), and the inductance value for inductor L3" is 3.5 times that of inductor L1" (or inductor L2"). The frequencies for both poles (e.g., pole 1 and pole 2) of the transfer function (or transmission coefficient) in FIG. 8B are equal to each other and both are smaller than the frequency of the zero of the transfer function. The transmission coefficient magnitudes 802 and 806 indicate that the circuit 700 can act as a band-pass filter with a passband sandwiched between two stop-bands.

Figure 8C:
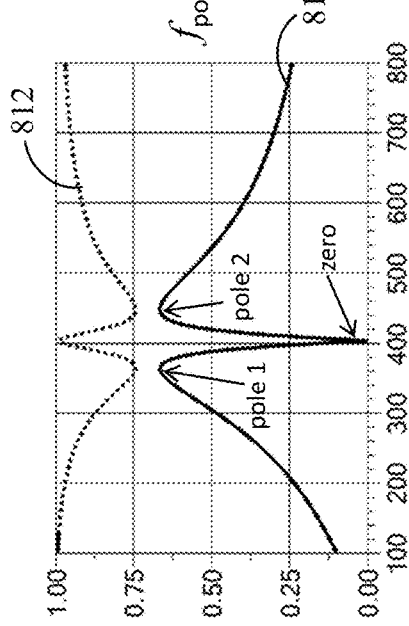

FIG. 8C shows the transmission coefficient magnitude 810 and the reflective coefficient magnitude 812 between ports P1" and P2" of circuit 700 when the capacitance value for capacitor C3" is half that of capacitor C1" (or capacitor C2"), and the inductance value for inductor L3" is twice that of inductor L1" (or inductor L2"). The frequency of the first pole of the transmission coefficient is smaller than the frequency of the zero of the transmission coefficient, and the frequency of the zero of the transmission coefficient is smaller than the frequency of the second pole of the transmission coefficient. Accordingly, and as indicated by the transmission coefficient magnitude 810, the circuit 700 can act as a series of two band-pass filters with respective passbands separated by a stopband (or notch). The stopband corresponds to the zero of the transmission coefficient. The circuit 700 can also be viewed as a combination of a band-pass filter and a notch filter with a respective stopband arranged within the passband of the band-pass filter.

Figure 8E:
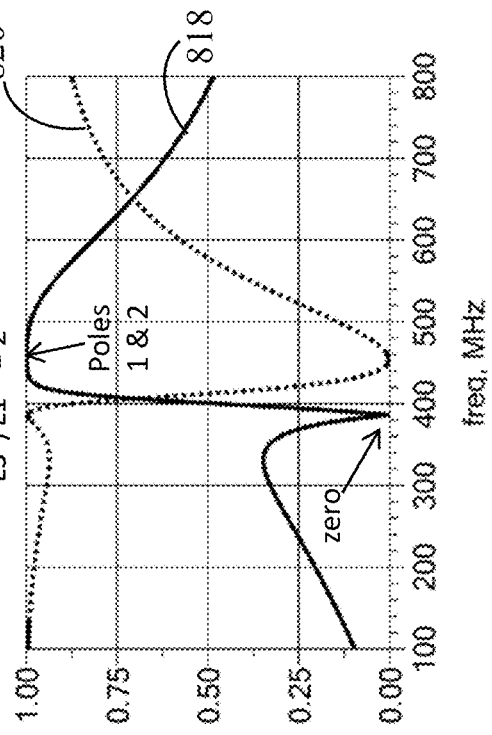
Figure 8D:
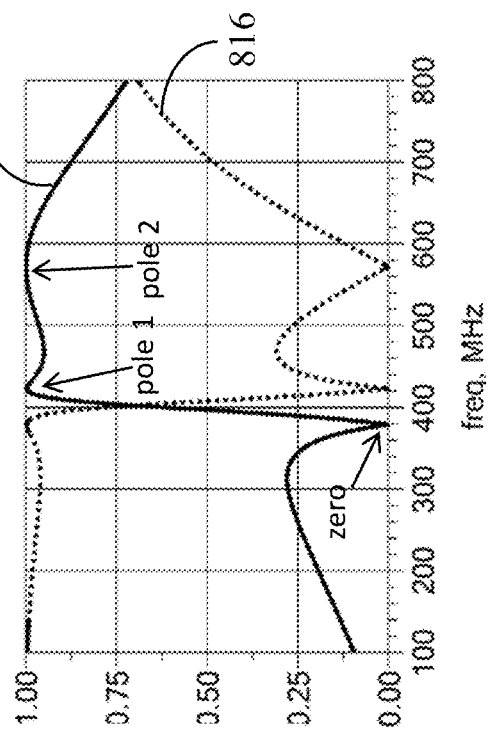

FIG. 8D shows the transmission coefficient magnitude 814 and the reflective coefficient magnitude 816 between ports P1" and P2" of circuit 700 when the capacitance value for capacitor C1" (or capacitor C2") is five times that of capacitor C3", and the inductance value for inductor L3" is twice that of inductor L1" (or inductor L2"). In such case, the frequency of the zero of the transmission coefficient is smaller than the frequency of the first pole of the transmission coefficient, and the frequency of the first pole of the transmission coefficient is smaller than the frequency of the second pole of the transmission coefficient. FIG. 8E shows the transmission coefficient magnitude 818 and the reflective coefficient magnitude 820 between ports P1" and P2" of circuit 700 when the capacitance value for capacitor C1" (or capacitor C2") is 3.5 times that of capacitor C3", and the inductance value for inductor L3" is twice that of inductor L1" (or inductor L2"). In such case, the frequencies of the first and second poles of the transmission coefficient are equal and are greater than the frequency of the zero of the transmission coefficient. The plots 814 and 820 of transmission coefficient magnitude in FIGS. 8D and 8E indicate that the circuit 700 can act as a band-pass filter.

Considering the results shown in FIGS. 8A-8E, one can see that the characteristics of the band-pass filter represented by the circuit 700 can be designed to meet distinct desired specifications by properly selecting the capacitance and/or inductance values for the various components of the circuit 700. For instance, selecting the capacitance and/or inductance values such that both poles of the transmission coefficient are equal, or substantially similar, (such as the case in FIGS. 8B and 8E) can lead to a band-pass filter with a relatively narrow passband compared to cases where the two poles substantially different from one another. Also, the steepest cutoff edge of the band-pass filter (e.g., compared to the other cutoff edge on the side of the poles) occurs between the zero of the transmission coefficient and one of the poles (e.g., the pole closest to the zero). Furthermore, selecting the capacitance and/or inductance values for the various components of the circuit 700 such that the zero of the transmission coefficient is located between the two poles of the transmission coefficient can result in a band-pass filter with two relatively narrow passbands separated by a stopband (or notch) corresponding to the zero of the of the transmission coefficient.

Figure 9:
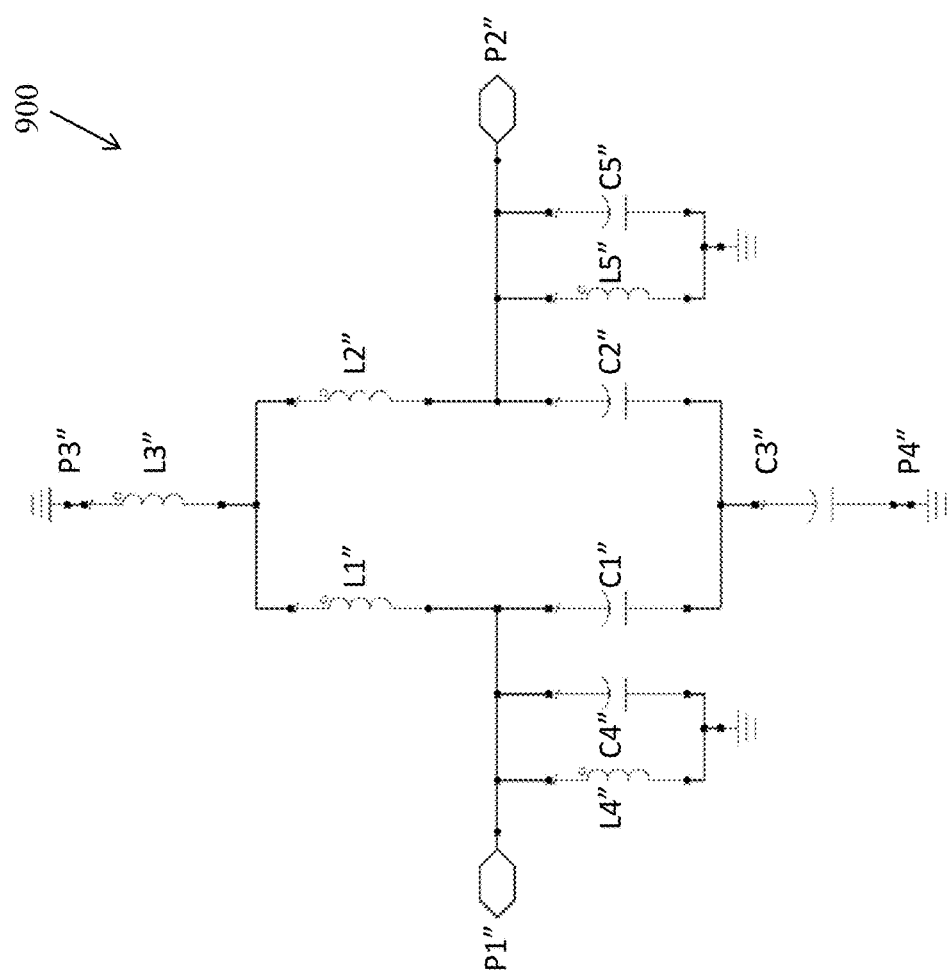
FIG. 9 shows a circuit representing another example implementation of the elementary Fano resonator circuit shown in FIG. 6, according to inventive concepts of this disclosure.

Referring to FIG. 9, a circuit 900 representing another example implementation of the elementary Fano resonator circuit 600 shown in FIG. 6 is shown, according to inventive concepts of this disclosure. The circuit 900 can be similar to circuit 700 except that it can further include the capacitors C4" and C5" and the inductors L4" and L5". The inductor L4" and the capacitor C4" can be electrically coupled (or connected) in parallel between the port P1" and the electric ground. The inductor L5" and the capacitor C5" can be electrically coupled (or connected) in parallel between the port P2" and the electric ground. The circuit 900 can provide similar passband performance as circuit 700. However, the circuit 900 can provide better out-of-band signal suppression at the expense of more inductive and/or capacitive components (e.g., additional capacitors C4" and C5" and additional inductors L4" and L5").

Referring back to FIG. 6, other arrangements of the inductive and/or capacitive components 620, 622, 624, 626, 628, and 630 can be employed. For example, both components 620 and 624 may be of the same type (e.g., both inductors or both capacitors) and/or both components 622 and 626 may be of the same type. The component 628 may be of different type than component 620 and/or component 622. The component 630 may be of different type than component 624 and/or component 626.

Figure 10:
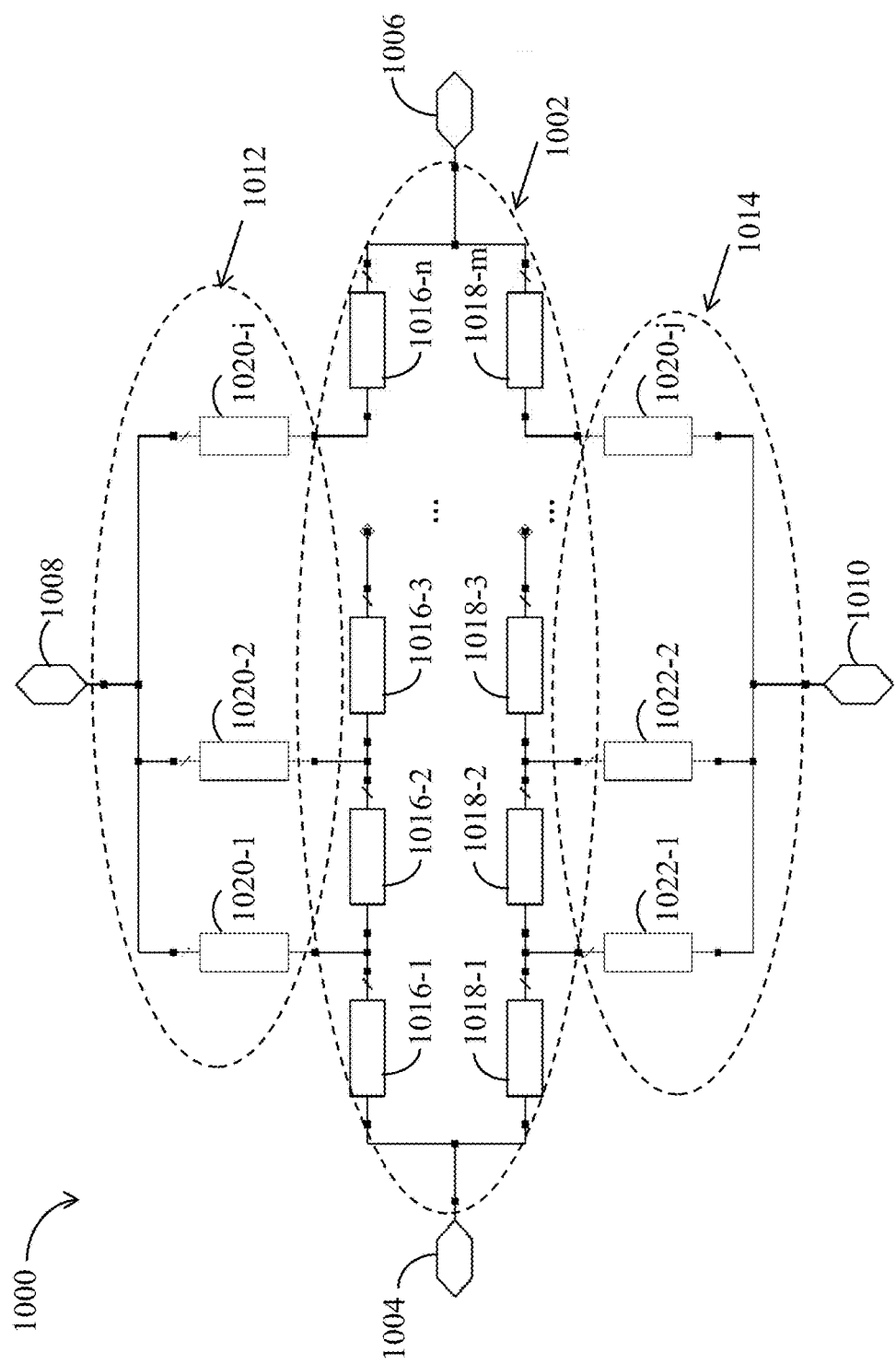
FIG. 10 shows a block diagram illustrating a third example embodiment of an elementary Fano resonator circuit, according to inventive concepts of this disclosure.

Referring now to FIG. 10, a block diagram illustrating a third example embodiment of an elementary Fano resonator circuit 1000 is shown, according to inventive concepts of this disclosure. The elementary Fano resonator circuit (also referred to herein as Fano resonator element) 1000 can be of higher order than the Fano resonator elements 100 and 600 shown in FIGS. 1 and 6, respectively. The elementary Fano resonator circuit 1000 can include a closed loop circuit 1002, four ports 1004, 1006, 1008, 1010, a first plurality of parallel branches 1012, and a second plurality of parallel branches 1014. The closed loop circuit 1002 can include a combination of at least six inductive and/or capacitive components. For instance, the closed loop circuit 1002 can include inductive and/or capacitive components 1020-1 to 1020-$n$ and 1022-1 to 1022-$m$. The first plurality of parallel branches 1012 can connect a plurality of nodes of the closed loop circuit to the port 1008, and the second plurality of parallel branches 1014 can connect another plurality of nodes of the closed loop circuit 1002 to the port 1010.

Each branch of the first plurality of parallel branches 1012 and the second plurality of parallel branches 1014 can include a corresponding inductive and/or capacitive component. For instance, the first plurality of parallel branches 1012 can include i branches including the inductive and/or capacitive components 1020-1 to 1020-$i$, respectively. The second plurality of parallel branches 1014 can include j branches including the inductive and/or capacitive components 1022-1 to 1022-$j$, respectively. Each branch of the first plurality of parallel branches 1012 can be connected to the closed loop circuit 1002 at a corresponding node between a corresponding pair of the inductive and/or capacitive components 1016-1 to 1016-$n$, and each branch of the second plurality of parallel branches 1014 can be connected to the closed loop circuit 1002 at a corresponding node between a corresponding pair of the inductive and/or capacitive components 1016-1 to 1016-$m$. In some implementations, the integer n can be equal to m and the integer i and j can be equal to each other. The integers i and j may be both equal to n−1 with m=n.

In general, any pair of the ports 1004, 1006, 1008, and 1010 can operate as input and output ports while the other ports can be connected to the electric ground or can be left open. In the case where a port is left open, that port may be considered as omitted or not part of the elementary Fano resonator circuit 1000. For instance, ports 1004 and 1006 can operate as the input and output ports while ports 1008 and 1010 can be connected to the electric ground. Alternatively, ports 1008 and 1010 can operate as the input and output ports of the elementary Fano resonator circuit 1000, while ports 1004 and 1006 can be left open or omitted. Similar to the Fano resonator elements 100 and 600 shown in FIGS. 1 and 6, respectively, the closed loop circuit 1002 coupled to all ports 1004, 1006, 1008, and 1010 allows for at least two transmission paths (or transmission channels) between any pair of input and output ports.

Figure 11:
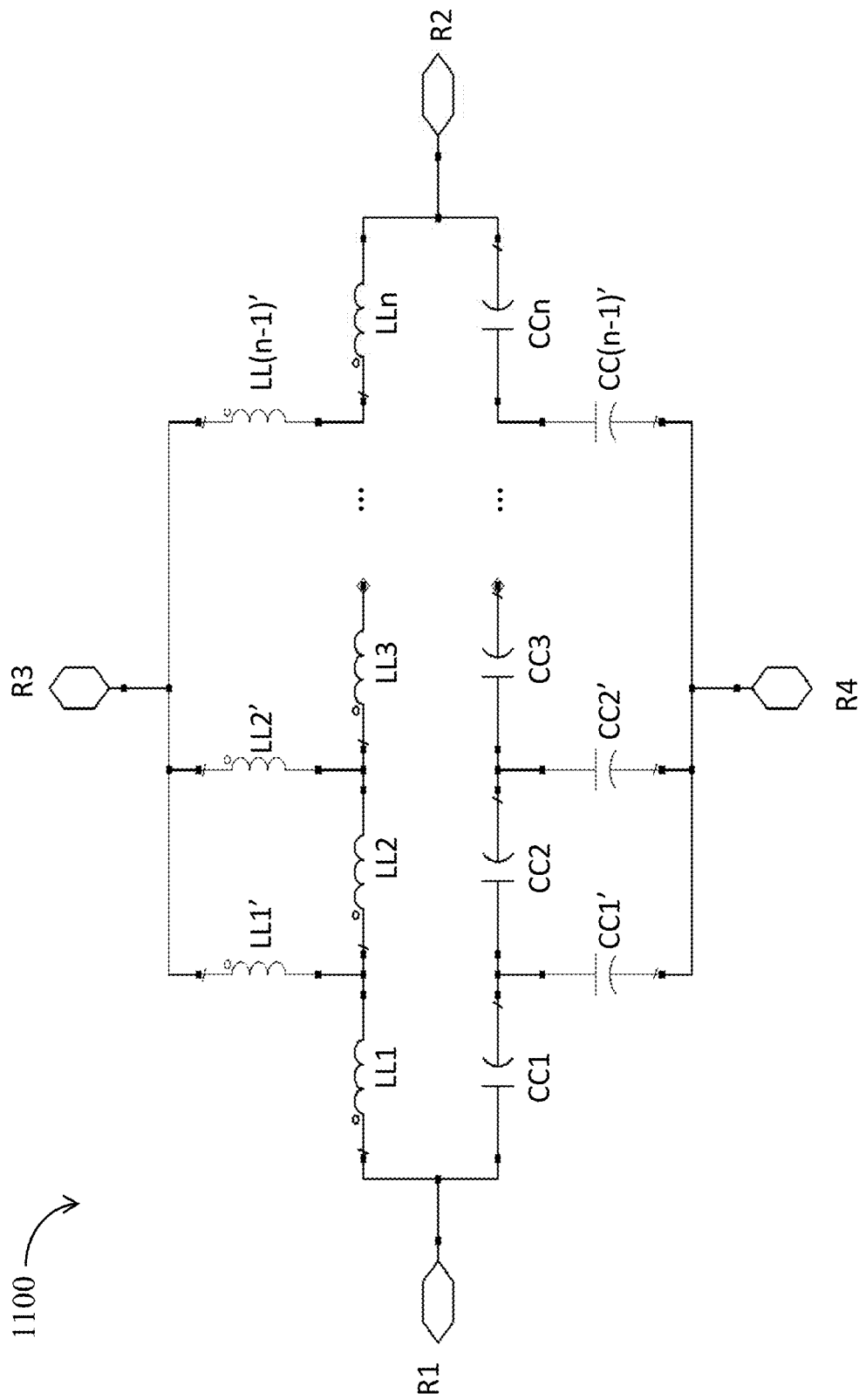
FIG. 11 shows a circuit representing an example implementation of the elementary Fano resonator circuit shown in FIG. 10, according to inventive concepts of this disclosure.

Referring to FIG. 11, a circuit 1100 representing an example implementation of the elementary Fano resonator circuit 1000 shown in FIG. 10 is shown, according to inventive concepts of this disclosure. The ports R1, R2, R3 and R4 correspond to the ports 1004, 1006, 1008, and 1010 of the elementary Fano resonator circuit 1000, respectively. The components 1020-1 to 1020-$n$ can be implemented as inductors LL1 to LL$n$, respectively. The components 1020-1 to 1020-$n$ can be implemented as inductors LL1 to LL$n$, respectively. The integer m is assumed to be equal to n and the components 1022-1 to 1022-$m$ can be implemented as capacitors CC1 and CC$n$. Also, the integers i and j are assumed to be both equal to n−1 and the component 1020-1 to 1020-$i$ can be implemented as inductors LL1' to LL(n−1)', while the components 1022-1 to 1022-$j$ can be implemented as capacitors CC1' to CC(n−1)'. The circuit 1100 represents an illustrative example implementation of the elementary Fano resonator circuit 1000 and other implementations are also contemplated by the current disclosure. For instance, the components 1020-1 to 1020-$n$ can be implemented as capacitors or a combination of inductors and capacitors. Also, the components 1022-1 to 1022-$m$ can be implemented as inductors or a combination of inductors and capacitors.

Elementary Fano resonator circuits (e.g., Fano resonator elements 100, 600 and 1000 or a combination thereof) can be used as basic circuit blocks to design and build filters with some desired characteristics. In the following, various arrangements of pluralities of Fano resonator elements for building various filters are discussed. It is to be noted, however, that the examples provided below serve to illustrate the concept of using elementary Fano resonator elements as building blocks in designing and/or constructing filter circuits, and should not be interpreted as limiting. Specifically, many other arrangements or couplings of Fano resonator elements beyond the ones described herein are also contemplated by this disclosure. Furthermore, as used herein, an elementary Fano resonator circuit can include a (i) closed loop circuit including a combination of at least three inductive and/or capacitive components, (ii) at least two ports with at least one port of the at least two ports corresponding to a node not within the closed loop circuit, and (iii) a branch including at least one other inductive or capacitive component and extending between a node of the closed loop circuit and a port of the at least one port corresponding to a node not within the closed loop circuit.

Figure 12A:
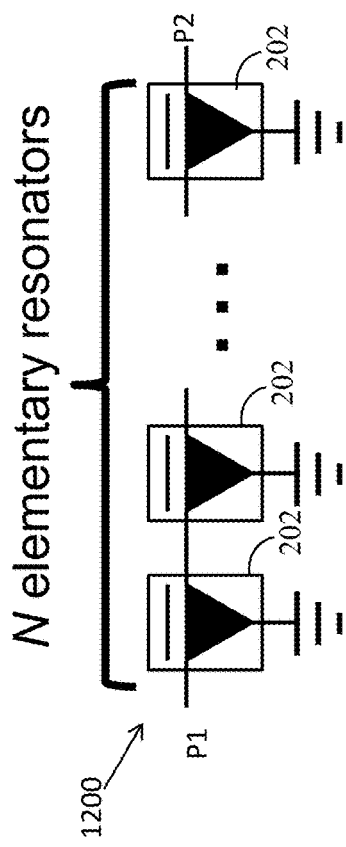
FIGS. 12A and 12B show a block diagram illustrating an arrangement of elementary Fano resonator circuits forming a low-pass filter and corresponding simulation results, according to inventive concepts of this disclosure.
Figure 12B:
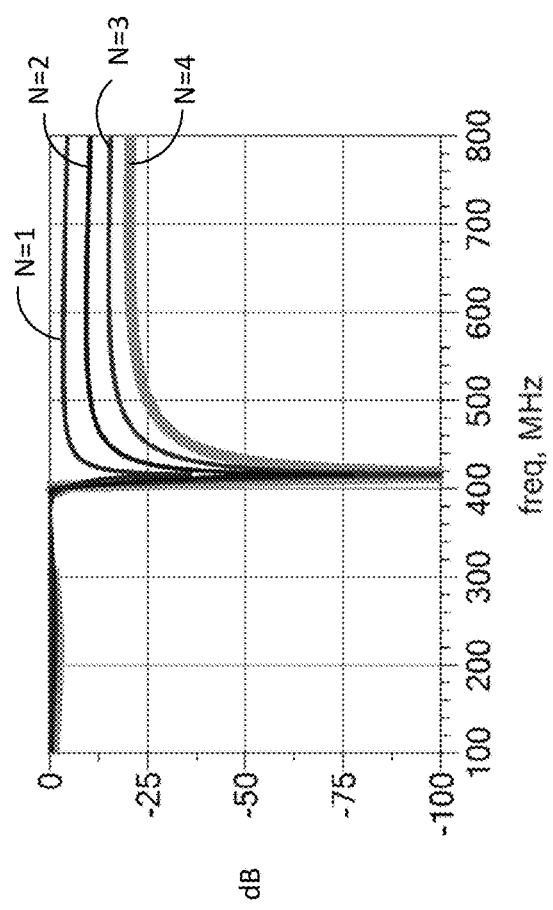

Referring to FIGS. 12A and 12B, a block diagram illustrating an arrangement of elementary Fano resonator circuits forming a low-pass filter and corresponding simulation results are shown, according to inventive concepts of this disclosure. The circuit 1200 can include a plurality of (or N) elementary Fano resonator circuits 200 (shown in FIG. 2 with corresponding symbol 202) connected in series and forming a low-pass filter circuit, where N is an integer. In the elementary Fano resonator circuits 200, ports P1 and P2 are used as input and output ports, while ports P3 are connected to the electric ground. Consecutive elementary Fano resonator circuits 200 of the circuit 1200 can be connected to each other via the respective ports P1 and P2.

The plots in FIG. 12B illustrate the transmission coefficient (or the transfer function) magnitude of the circuit 1200 for various values of N. These simulation results indicate that within the passband, the performances of the low-pass filter circuit 1200 for various values of N are very similar. The signal rejection (or suppression) within the stopband increases (or improves) as the number of Fano resonator elements (or N) increases. Also, as the number of Fano resonator elements (or N) increases, the cutoff edge of the low-pass filter gets slightly steeper.

The circuit design (or structure) illustrated in FIG. 12A may not require inter-stage matching between the various Fano resonator elements 200 indicated by the symbols 202. Also, considering the relatively steep cutoff edges of the transfer functions shown in FIG. 12B, the resulting low-pass filter circuit 1200 provides a good approximation of an ideal low-pass filter and as such can be viewed as a brick wall low-pass filter circuit. While the circuit 1200 represents a series arrangement of a plurality of the elementary Fano resonator circuit 200, a low-pass filter circuit can also be achieved using a series arrangement of other Fano resonator elements, for example, that individually act low pass filters.

Figure 13A:
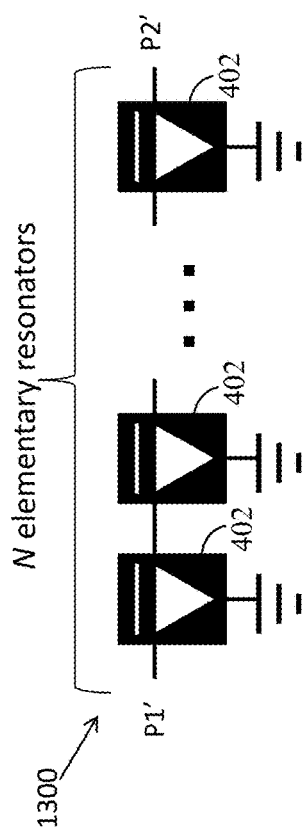
FIGS. 13A and 13B show a block diagram illustrating an arrangement of elementary Fano resonator circuits forming a high-pass filter and corresponding simulation results, according to inventive concepts of this disclosure.
Figure 13B:
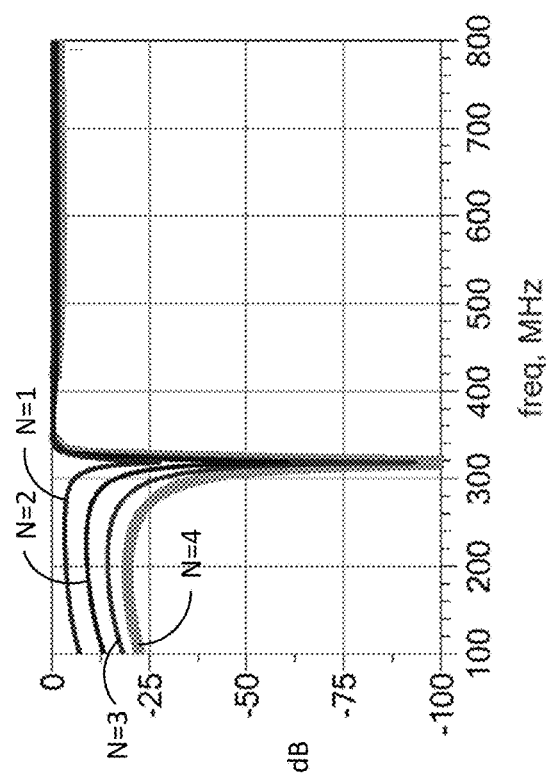
Figure 14A:
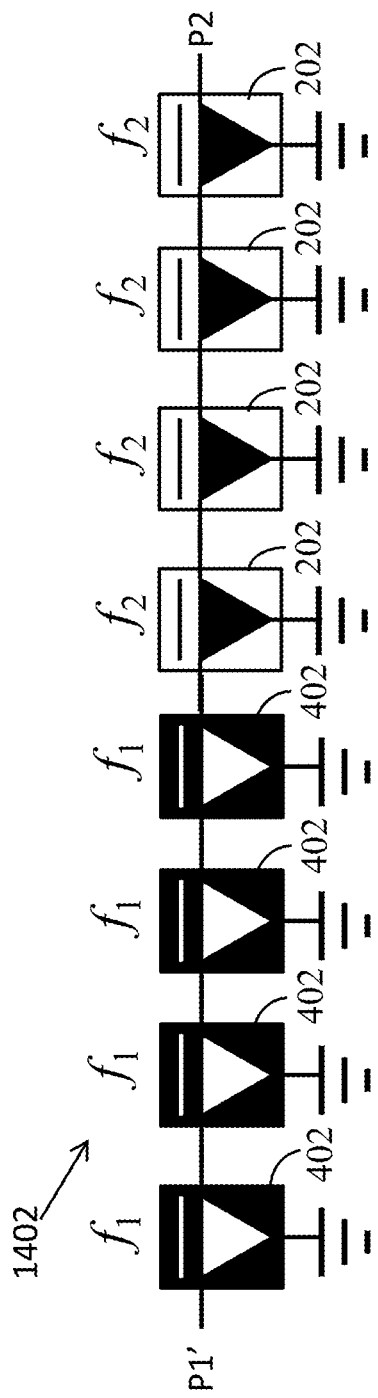
FIGS. 14A-14D show a block diagram illustrating various arrangements of elementary Fano resonator circuits forming band-pass filters are shown, according to inventive concepts of this disclosure.
Figure 14B:
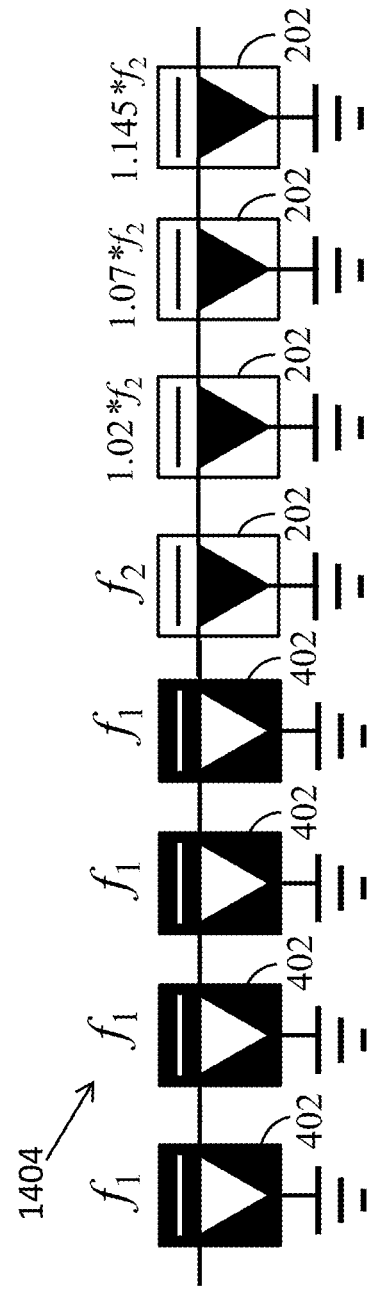
Figure 14C:
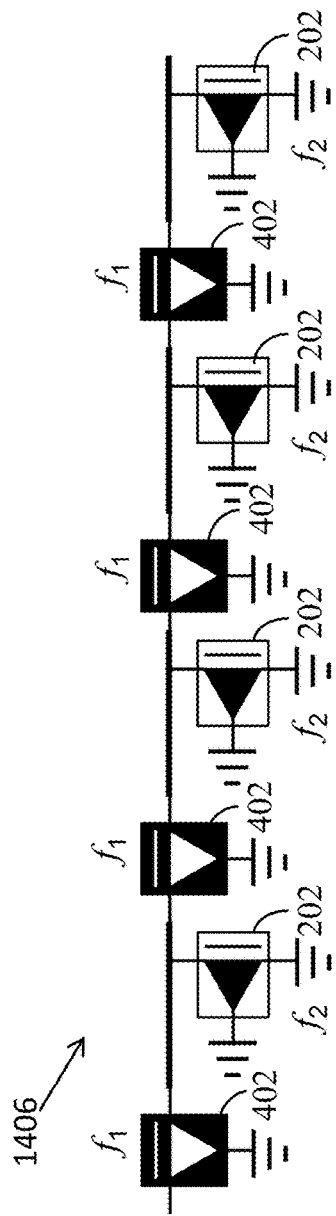
Figure 14D:
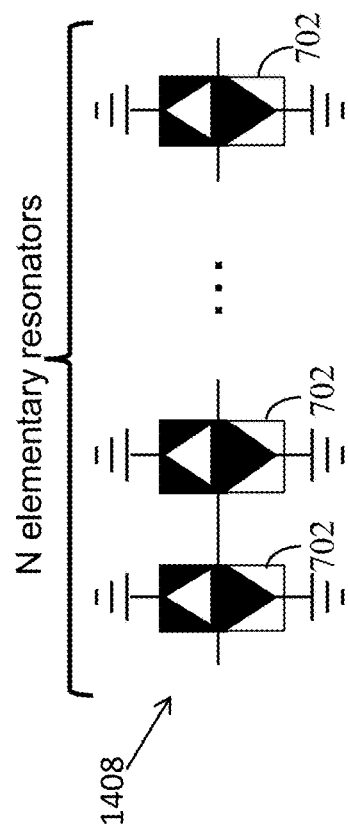

Referring to FIGS. 13A and 13B, a block diagram illustrating an arrangement of elementary Fano resonator circuits forming a high-pass filter and corresponding simulation results are shown, according to inventive concepts of this disclosure. The circuit 1300 includes a plurality of (or N) elementary Fano resonator circuits 400 (shown in FIG. 4 and having corresponding symbol 402) connected in series and forming a high-pass filter circuit, where N is an integer. In the elementary Fano resonator circuits 400, ports P1' and P2' are used as input and output ports, while ports P3' are connected to the electric ground. Consecutive elementary Fano resonator circuits 400 of the circuit 1300 can be connected to each other via the respective ports P1' and P2'.

The plots in FIG. 13B illustrate the transmission coefficient (or the transfer function) magnitude of the circuit 1300 for various values of N. These simulation results indicate that within the passband, the performances of the high-pass filter circuit 1300 for various values of N are very similar. The signal rejection (or suppression) within the stopband increases as the number of Fano resonator elements (or N) increases. Also, as the number of Fano resonator elements (or N) increases, the cutoff edge of the high-pass filter associated with circuit 1300 gets slightly steeper.

Similar to the circuit design 1200, the circuit design (or structure) 1300 illustrated in FIG. 13A may not require inter-stage matching between the various Fano resonator elements 400 indicated by the symbols 402. Also, considering the relatively steep cutoff edges of the transfer functions shown in FIG. 13B, the resulting high-pass filter circuit 1300 provides a good approximation of an ideal high-pass filter and, as such, can be viewed as a brick wall high-pass filter circuit. While the circuit 1300 represents a series arrangement of a plurality of the elementary Fano resonator circuit 400, a high-pass filter circuit can also be achieved using other arrangements of other Fano resonator elements.

Referring to FIGS. 14A-14D, block diagrams illustrating various arrangements of elementary Fano resonator circuits forming band-pass filters are shown, according to inventive concepts of this disclosure. The circuit 1402 (shown in FIG. 14A) can include a first plurality of elementary Fano resonator circuits 400 (shown in FIG. 4 and having corresponding symbol 402) and a second plurality of elementary Fano resonator circuits 200 (shown in FIG. 2 and having corresponding symbol 202), all connected in series and forming a band-pass filter circuit. In the elementary Fano resonator circuits 400, ports P1' and P2' are used as input and output ports, while ports P3' are connected to the electric ground. Also, in the elementary Fano resonator circuits 200, ports P1 and P2 can be used as input and output ports, while ports P3 are connected to the electric ground. Each of the elementary Fano resonator circuits 400 in the circuit 1402 can act as a high-pass filter with a common cutoff frequency $f_1$. Each of the elementary Fano resonator circuits 200 in the circuit 1402 can act as a low-pass filter with a common cutoff frequency $f_2$. Accordingly, the band-pass filter corresponding to the circuit 1402 can have a passband defined by the frequency interval $[f_1, f_2]$. Also, since both the elementary Fano resonator circuits 200 and the elementary Fano resonator circuits 400 are characterized with steep cutoff edges, the resulting band-pass filter corresponding to the circuit arrangement 1402 can be viewed as a brick wall band-pass filter.

The circuit 1404 (shown in FIG. 14B) is similar to the circuit 1402, except that the inductive and/or capacitive components of the circuits 200 are tuned to adjust the cutoff frequencies of the circuits 200. Specifically, the circuits 200 in the circuit 1404 are now associated with slightly distinct cutoff frequencies (e.g., $f_2$, 1.02 $f_2$, 1.07 $f_2$, and 1.145 $f_2$). This allows for creation of additional zeros in the stop band thus improving out-of-band rejection. In a similar manner the circuits 400 in the circuit 1404 can be tuned to adjust the resonant frequency of individual resonators to create additional zeros in the low frequency stop band. While both circuits 1402 and 1404 are shown to include 4 elementary resonator circuits 200 and four elementary resonator circuits 400, any number of each of these Fano resonator elements can be used. In some embodiments, the number of elementary resonator circuits 200 can be different than the number of elementary resonator circuits 400.

The circuit 1406 (shown in FIG. 14C) includes a first number (e.g., 4) of elementary Fano resonator circuits 400 connected to each other in series, and a second number (e.g., 4) of elementary Fano resonator circuits 200. The ports P1' and P2' of the elementary Fano resonator circuits 400 can act as input and output ports of corresponding Fano resonator elements 400, while the ports P3' are connected to the electric ground. Each of the elementary Fano resonator circuits 200 in circuit 1406 can be electrically coupled (or connected) between a P1' (or P2') port of a respective elementary Fano resonator circuit 400 in the series arrangement and the electric ground. For instance, the P1 port of each elementary Fano resonator circuit 200 can be connected to node connecting two corresponding elementary Fano resonator circuits 400, while the ports P2 and P3 of the same elementary Fano resonator circuit 200 can be connected to the electric ground.

The circuit 1408 (shown in FIG. 14D) can include a plurality of elementary Fano resonator circuits 700 (shown in FIG. 7 and having corresponding symbol 702) connected in series and forming a band-pass filter circuit. While the circuit 1408 is designed (or built) based on the elementary Fano resonator circuits 700, a similar arrangement can be constructed using the elementary Fano resonator circuits 900, the elementary Fano resonator circuits 1100, other elementary Fano resonator circuits acting as separate band-pass filters, or a combination thereof. In the elementary Fano resonator circuits 700 of circuit 1408, ports P1" and P2" can be used as input and output ports for each corresponding Fano resonator element, while ports P3" and P4" can be connected to the electric ground. Considering the various performances of the versions of the elementary Fano resonator circuit 700 discussed above with regard to FIGS. 8A-8E, various band-pass filters can be designed using the arrangement of the circuit 1408.

Figure 15:
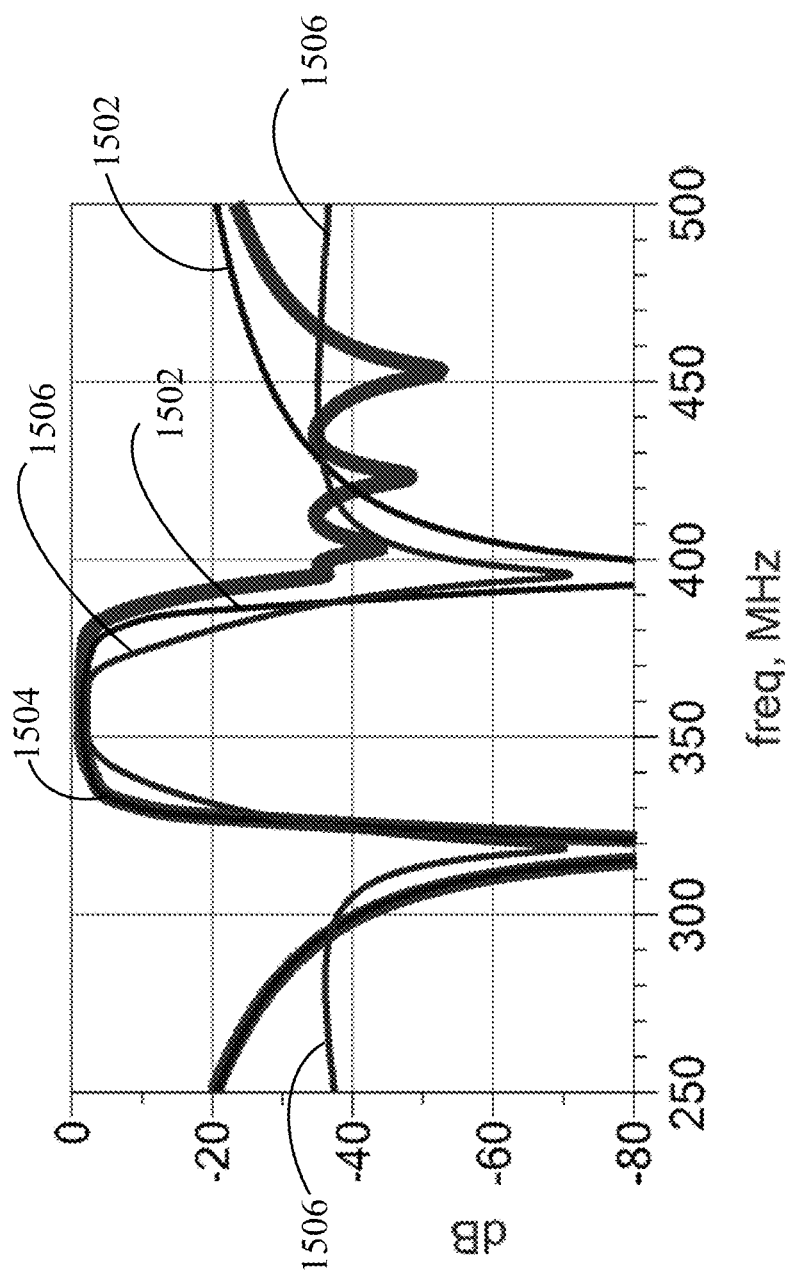
FIG. 15 shows simulations results for the band-pass circuits shown in FIGS. 14A-14C, according to inventive concepts of this disclosure.

Referring to FIG. 15, simulations results for the band-pass circuits 1402, 1404 and 1406 are shown, according to inventive concepts of this disclosure. The plot 1502 represents the transmission coefficient (or transfer function) magnitude for the band-pass filter of circuit 1402 (shown in FIG. 14A). The plot 1504 represents the transmission coefficient (or transfer function) magnitude for the band-pass filter of circuit 1404 (shown in FIG. 14B). The plot 1506 represents the transmission coefficient (or transfer function) magnitude for the band-pass filter of circuit 1406 (shown in FIG. 14C). These simulation results indicate that the circuit 1402 provides the deepest notches and the sharpest cutoff edges but relatively worse out-of-band signal rejection (or suppression) compared to the circuits 1404 and 1408. The plot 1504 illustrates that individual Fano resonator elements (generally, both types of Fano resonator elements 200 and 400) can be tuned for improved out-of-band rejection at the expense of the depth of the notches and the sharpness of the cutoff edges being different on both sides of the passband of the band-pass filter. The circuit 1406 provides better out-of-band signal rejection (or suppression), compared to circuits 1402 and 1404, at the expense of the sharpness of the cutoff edges of the band-pass filter.

Figure 16E:
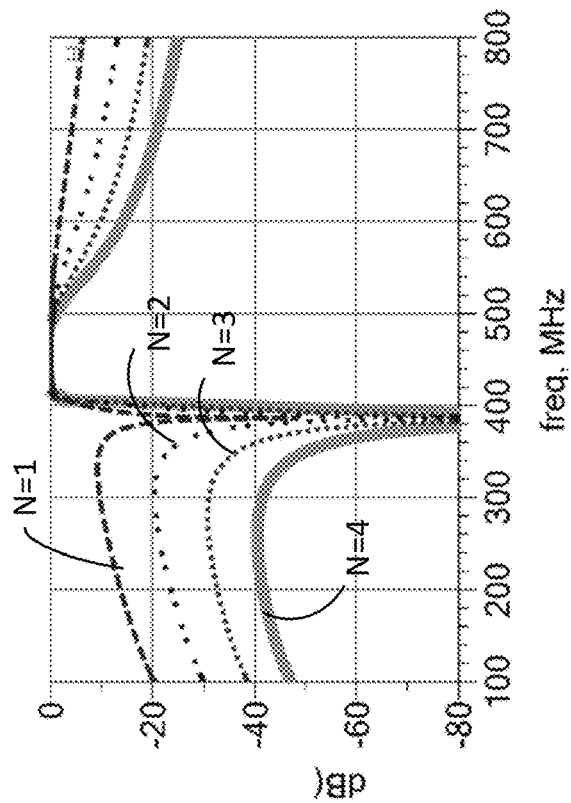
Figure 16D:
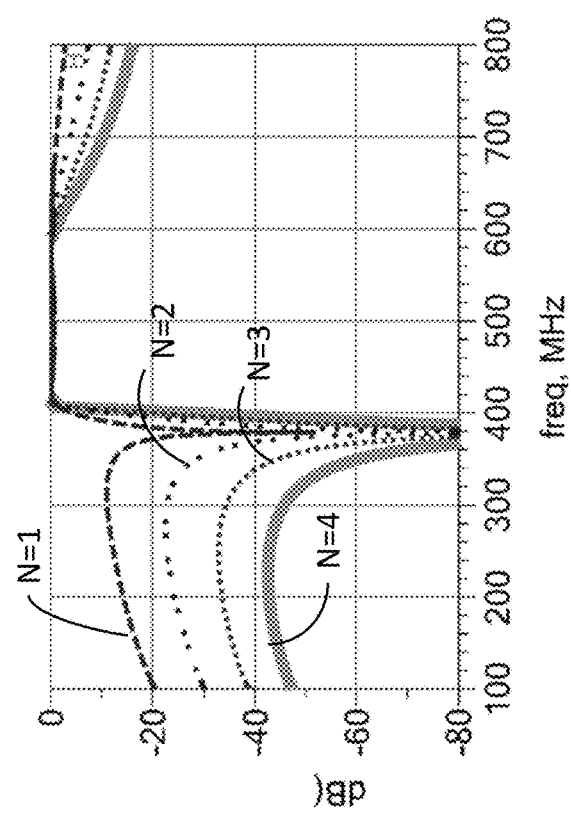

Referring to FIGS. 16A-16E, simulations results for various versions of the band-pass circuit 1408 are shown, according to inventive concepts of this disclosure. Magnitudes of the transmission coefficient (or transfer function) of various versions of the circuit 1408 when using various numbers of elementary Fano resonator circuits 700 are shown. The results shown in FIG. 16A-16E correspond to versions of the circuit 1408 using the elementary Fano resonator circuits 700 discussed with regard to FIGS. 8A-8E, respectively. The simulation results indicate substantial improvement of out-of-band performance as the number of Fano resonator elements 700 increases. In some implementations, the elementary Fano resonator circuits 700 (or the corresponding components) of the circuit 1408 can be tuned (or set) to achieve in-band performance similar to that of circuits 1402 and 1404 and substantially improved out-of-band performance. For instance, designing the circuit 1408 to include a first combination of elementary Fano resonator circuits 700 as shown in FIG. 16A or 16B and second combination of elementary Fano resonator circuits 700 as shown in FIG. 16D or 16E (e.g., all connected in series) can lead to a corresponding bandpass filter with steep cutoff edges on both sides of the passband.

Figure 17A:
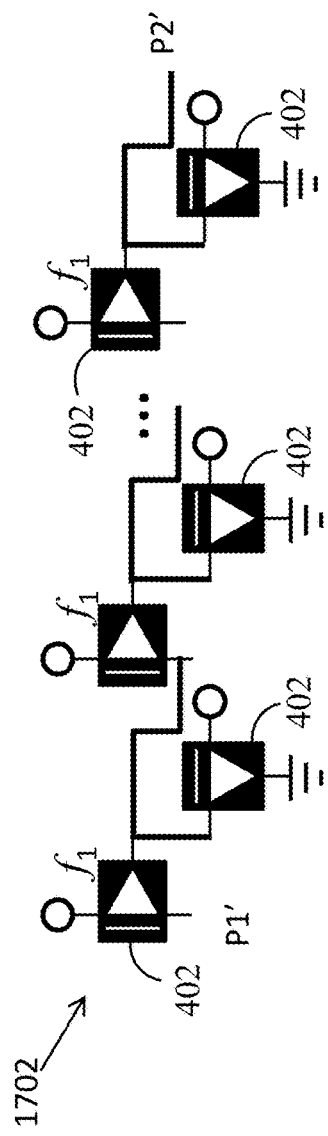
FIGS. 17A and 17B show block diagrams illustrating other arrangements of elementary Fano resonator circuits to form band-pass filters, according to inventive concepts of this disclosure.
Figure 17B:
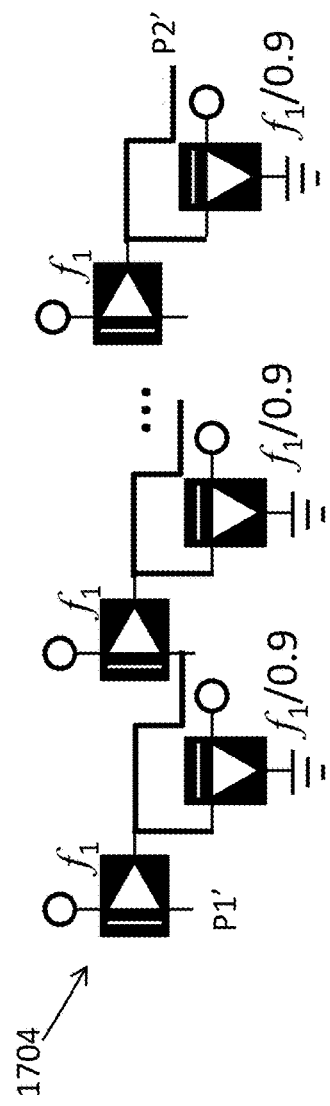

Referring to FIGS. 17A and 17B, block diagrams illustrating other arrangements of elementary Fano resonator circuits to form band-pass filters are shown, according to inventive concepts of this disclosure. The circuit 1702 can include a first set of elementary Fano resonator circuits 400 where the corresponding P1' and P3' ports are used as input and output ports while the corresponding P2' ports are left open (or omitted). This first set of elementary Fano resonator circuits 400 can be connected in series where the P3' port of one Fano resonator element 400 is connected to the P1' port of the following Fano resonator element 400 of the first set. The circuit 1702 can also include a second set of elementary Fano resonator circuits 400 where the respective P1' ports are connected to P1' (or P3') ports of corresponding elementary Fano resonator circuits 400 of the first set, the respective P2' ports are left open (or omitted), and the respective P3' ports are connected to the electric ground. All elementary Fano resonator circuits 400 of the first and second sets can be associated with the same (or almost the same) cutoff frequency.

The circuit 1704 (shown in FIG. 17B) is similar to circuit 1702 of FIG. 17A, except that the elementary Fano resonator circuits 400 of the second set (or the corresponding component) are tuned or adjusted to modify the corresponding cutoff frequency. For instance the first set of elementary Fano resonator circuits 400 can be associated with a first common cutoff frequency equal to $f_1$, while the second set of elementary Fano resonator circuits 400 can be associated with a second common cutoff frequency equal to α. $f_1$ where α can be an number close to 1 (e.g., 0.9 or 0.95). In general, each of the elementary Fano resonator circuits 400 in the first set and/or the second set can be tuned separately or differently from other Fano resonator elements.

Figure 17D:
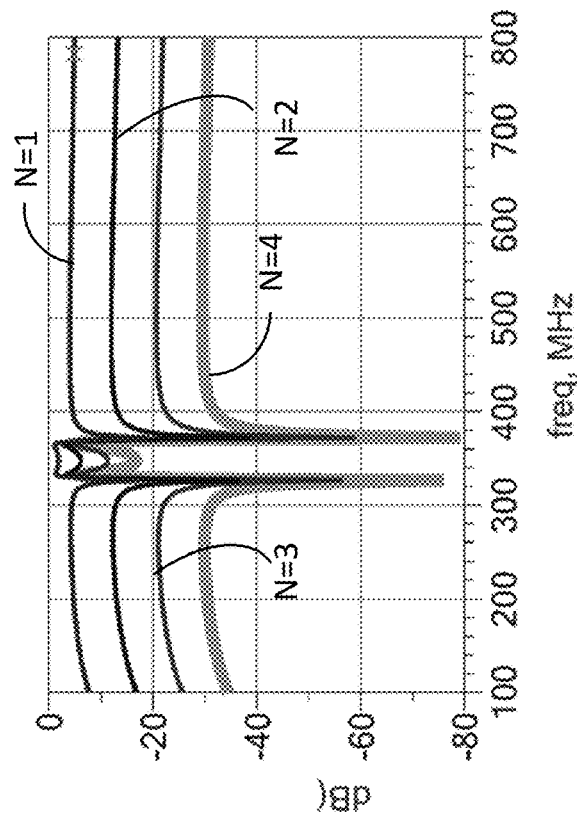
FIGS. 17C and 17D show simulation results corresponding to band-pass filter circuits shown in FIGS. 17A and 17B, respectively, according to inventive concepts of this disclosure.
Figure 17C:
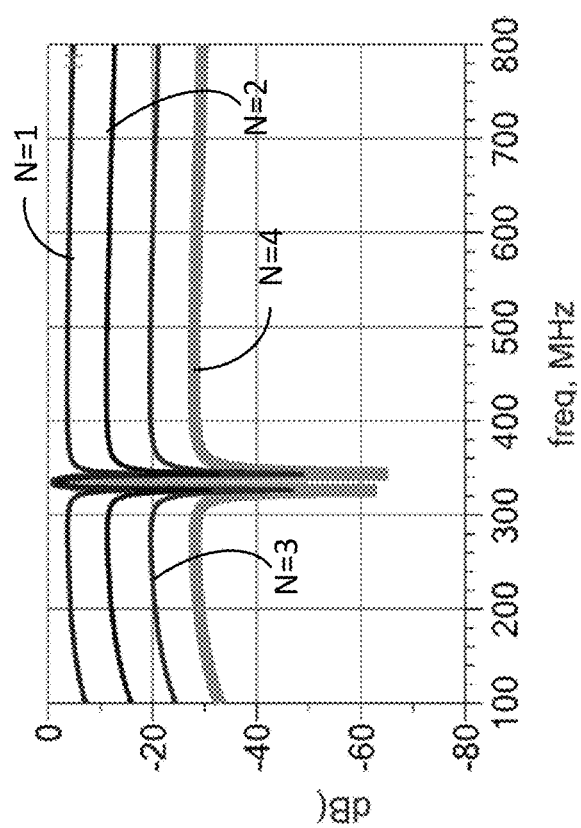

FIGS. 17C and 17D show simulation results corresponding to the circuits 1702 and 1704, respectively, according to inventive concepts of this disclosure. The simulation results indicate that as the number of elementary Fano resonator circuits 400 in the first and second sets increases the out-of-band performance substantially improves and the notches associated with the cutoff edges get deeper and the corresponding cutoff edges get steeper (or sharper). However, as the number of elementary Fano resonator circuits 400 in the first and second sets increases the in-band performance degrades slightly as a curve shaping the passband gets slightly deeper.

Referring to FIGS. 18A and 18B, block diagrams illustrating other arrangements of elementary Fano resonator circuits to form other types of filters are shown, according to inventive concepts of this disclosure. The circuit 1802 (shown in FIG. 18A) can include a plurality of elementary Fano resonator circuits 200 (shown in FIG. 2 and having corresponding symbol 202) where the corresponding P1 and P3 ports are used as input and output ports while the corresponding P2 ports are left open (or omitted). The circuit 1804 (shown in FIG. 18B) can include a plurality of elementary Fano resonator circuits 400 (shown in FIG. 4 and having corresponding symbol 402) where the corresponding P1' and P3' ports are used as input and output ports while the corresponding P2' ports are left open (or omitted).

The filter circuit configurations, based on elementary Fano resonator circuits, discussed above are provided for illustrative purposes and other configurations are contemplated by this disclosure. For instance, a filter circuit can include various types of Fano resonator elements (e.g., any combination of resonator elements 100, 200, 400, 600, 700, 900, 1000, 1100 and/or other types of Fano resonator elements). Also, Fano resonator elements of the same type with a filter circuit may have distinct frequency characteristics (e.g., poles, zeros, cutoff frequencies, etc.), distinct numbers of inductive and/or conductive components, corresponding inductive and/or capacitive components with distinct inductance and/or capacitance values. In some implementations, the components of one or more Fano resonator elements can be tunable (or variable). For instance a Fano resonator element of a filter circuit can include variable capacitor(s) (for example, varactor diodes) and/or variable inductor(s). Variable components allow for the corresponding filter characteristics to be tuned. Using filter circuit configurations discussed herein, the corresponding filters, when tuned, preserve their shape both in-band and out-of-band while the widths of such bands (e.g., passband (s) and stopband(s)) may change. Both frequency range and bandwidth can be tuned independently in a wide frequency range. Also, low and high frequency boundaries can be tuned independently or together, for example, by variation of capacitors and/or inductors of the corresponding filter circuit (or Fano resonator elements thereof). The location of notches, passband and position of the return loss maxima can be adjusted by tuning the resonance frequency of the Fano resonator elements.

According to example embodiments, an advantage of the elementary Fano resonator elements discussed above is that asymmetric Fano resonances can be enabled with components having relatively low coupling parameters (Q~50-500). Lower Q (~50) can result in higher insertion loss and lower level of rejection (or signal suppression) but will not erase Fano resonance completely.

Figure 19:
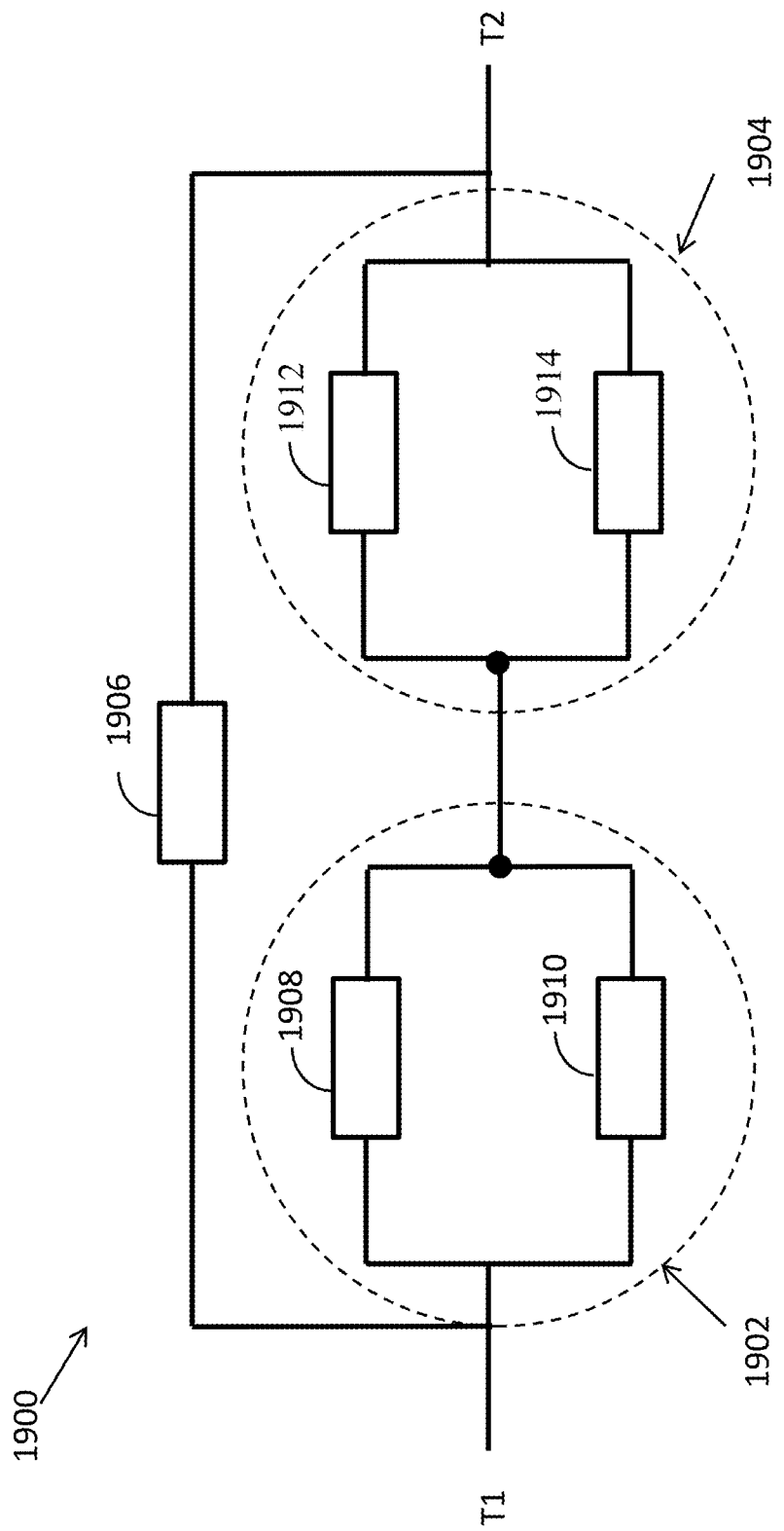
FIG. 19 shows a block diagram illustrating a Fano resonator circuit acting as a sharp notch filter, according to inventive concepts of this disclosure.

Referring to FIG. 19, a block diagram illustrating a Fano resonator circuiting to act as a notch filter is shown, according to inventive concepts of this disclosure. The circuit 1900 can include two radio frequency (RF) circuits 1902 and 1904 connected in series, and a branch including an inductive and/or capacitive component 1906. The branch can be arranged in parallel to the RF circuits 1902 and 1904. The circuit 1900 can include two ports T1 and T2 such that the port T1 can be coupled to one of the RF circuits and one end of the branch, and the port T2 can be coupled to the other RF circuit and the other end of the branch. Each of the RF circuits 1902 and 1904 can be a second-order circuit including a respective inductor and a respective conductor. In some implementations, the RF circuits 1902 and 1904 can include higher order (e.g., higher than second order) Rf circuits. The circuit 1900 can act as a notch filter with relatively steep cutoff edges and relatively deep notch (or high signal suppression within the corresponding notch. Accordingly, the circuit 1900 can be used to block signals at a specific frequency or signals within a relatively narrow band.

Figure 20:
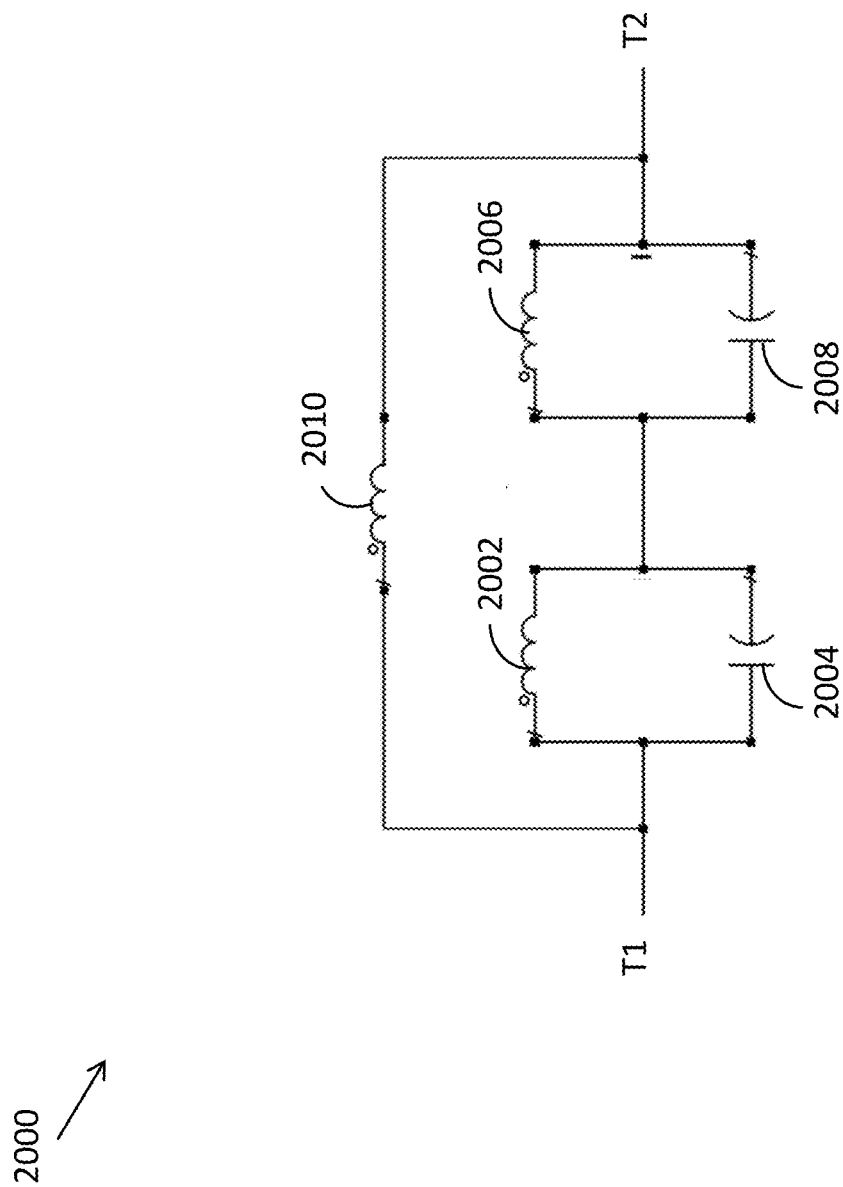
FIG. 20 shows a circuit illustrating an example implementation of the Fano resonator circuit shown in FIG. 19 according to inventive concepts of this disclosure.

Referring to FIG. 20, a circuit representing an example implementation of the Fano resonator circuit 1900 is shown, according to inventive concepts of this disclosure. The circuit 2000 can include two radio frequency (RF) circuits connected in series, where the first RF circuit includes the inductor 2002 and the capacitor 2004 and the second RF circuit includes the inductor 2006 and the capacitor 2008. The circuit 2000 can also include a branch including the inductor 2010, and arranged in parallel to the two RF circuits.

The construction and arrangement of the systems and methods are described herein as illustrative examples and are not to be construed as limiting. Although only a few embodiments have been described in detail in this disclosure, many modifications are possible (e.g., variations in sizes, dimensions, structures, shapes and proportions of the various elements, values of parameters, mounting arrangements, use of materials, colors, orientations). For example, the position of elements may be reversed or otherwise varied and the nature or number of discrete elements or positions may be altered or varied. Accordingly, all such modifications are intended to be included within the scope of the inventive concepts disclosed herein. The order or sequence of any operational flow or method of operations may be varied or re-sequenced according to alternative embodiments. Other substitutions, modifications, changes, and omissions may be made in the design, operating conditions and arrangement of the exemplary embodiments without departing from the broad scope of the inventive concepts disclosed herein.

What is claimed is:

1. A filter circuit comprising:
    a plurality of elementary Fano resonator circuits electrically coupled to each other, each elementary Fano resonator circuit including:
        a closed loop circuit including a combination of at least three inductive and/or capacitive components;
        at least two ports, wherein at least one port of the at least two ports corresponds to a node of the filter circuit not within the closed loop circuit; and
        a branch including at least one other inductive or capacitive component and extending between a node of the closed loop circuit and a port of the at least one port corresponding to a node of the filter circuit not within the closed loop circuit.

2. The filter circuit of claim 1, wherein the filter circuit is a low-pass filter.

3. The filter circuit of claim 1, wherein the filter circuit is a high-pass filter.

4. The filter circuit of claim 1, wherein the filter circuit is a band-pass filter.

5. The filter circuit of claim 1, wherein the transfer function of each elementary Fano resonator circuit of the plurality of elementary Fano resonator circuits includes one pole and one zero.

6. The filter circuit of claim 1, wherein the transfer function of each elementary Fano resonator circuit of the plurality of elementary Fano resonator circuits includes two poles and one zero.

7. The filter circuit of claim 1, wherein the closed loop circuit of each elementary Fano resonator circuit of the plurality of elementary Fano resonator circuits includes two capacitors and an inductor, and the branch of that elementary Fano resonator circuit includes a capacitor.

8. The filter circuit of claim 1, wherein the closed loop circuit of each elementary Fano resonator circuit of the plurality of elementary Fano resonator circuits includes two inductors and a capacitor, and the branch of that elementary Fano resonator circuit includes an inductor.

9. The filter circuit of claim 1, wherein the plurality of elementary Fano resonator circuits are electrically coupled to each other in series.

10. The filter circuit of claim 9, wherein the plurality of elementary Fano resonator circuits are electrically coupled to each other via ports corresponding to nodes within respective closed loop circuits.

11. The filter circuit of claim 9, wherein the plurality of elementary Fano resonator circuits are electrically coupled to each other via ports corresponding to nodes within respective closed loop circuits and nodes associated with respective branches.

12. The filter circuit of claim 1, wherein the plurality of elementary Fano resonator circuits include a first subset of elementary Fano resonator circuits associated with a first type of elementary Fano resonator circuits and a second subset of elementary Fano resonator circuits associated with a second type of elementary Fano resonator circuits.

13. The filter circuit of claim 1, wherein the first type of elementary Fano resonator circuits and the second type of elementary Fano resonator circuits differ with respect to a number of respective inductive components, a number of respective capacitive components, inductance values of respective inductive components, or capacitance values of respective capacitive components.

14. The filter circuit of claim 1, wherein the plurality of elementary Fano resonator circuits include a first subset of elementary Fano resonator circuits electrically coupled in series and a second subset of elementary Fano resonator circuits, each elementary Fano resonator circuit of the second subset electrically coupled between one of the ports of a respective elementary Fano resonator circuit in the first subset and an electric ground.

15. The filter circuit of claim 1, wherein at least two of the plurality of elementary Fano resonator circuits are associated with distinct frequency characteristics.

16. A filter circuit comprising:
    a plurality of elementary Fano resonator circuits electrically coupled to each other, each elementary Fano resonator circuit including:
        a closed loop circuit including a combination of at least four inductive and/or capacitive components;
        four ports, wherein two ports of the four ports correspond to nodes of the filter circuit not within the closed loop circuit; and
        a first branch including a first inductive or capacitive component and extending between a first node of the closed loop circuit and a first port of the two ports corresponding to nodes of the filter circuit not within the closed loop circuit; and a second branch including a second inductive or capacitive component and extending between a second node of the closed loop circuit and a second port of the two ports corresponding to nodes of the filter circuit not within the closed loop circuit.

17. The filter circuit of claim 16, wherein the closed loop circuit of each elementary Fano resonator circuit of the plurality of elementary Fano resonator circuits includes two inductors and two capacitors, the first branch of that elementary Fano resonator circuit includes an inductor, and the second branch of that elementary Fano resonator circuit includes a capacitor.

18. The filter circuit of claim 16 further comprising:

a first inductor and a first capacitor electrically coupled in parallel between a third port of the filter circuit and an electric ground, the third port different than any of the two ports corresponding to nodes of the filter circuit not within the closed loop circuit; and a second inductor and a second capacitor electrically coupled in parallel between a fourth port of the filter circuit and an electric ground, the fourth port different than any of the two ports corresponding to nodes of the filter circuit not within the closed loop circuit.

19. A filter circuit comprising:

a plurality of elementary Fano resonator circuits electrically coupled to each other, each elementary Fano resonator circuit including:

a closed loop circuit including a combination of at least six inductive and/or capacitive components;

four ports, wherein two ports of the four ports correspond to nodes of the filter circuit not within the closed loop circuit; and a plurality of first parallel branches including a first plurality of parallel inductive and/or capacitive components and extending between a corresponding plurality of first nodes of the closed loop circuit and a first port of the two ports corresponding to nodes of the filter circuit not within the closed loop circuit; and a plurality of second parallel branches including a second plurality of parallel inductive and/or capacitive components and extending between a corresponding plurality of second nodes of the closed loop circuit and a second port of the two ports corresponding to nodes of the filter circuit not within the closed loop circuit.

20. The filter circuit of claim 19, wherein the closed loop circuit includes N inductors arranged in parallel to N capacitors where N is an integer number, the plurality of first parallel branches electrically coupled to nodes of the N inductors, and the plurality of second parallel branches electrically coupled to nodes of the N capacitors.

* * * * *